US009514807B2

(12) United States Patent
Kang et al.

(10) Patent No.: US 9,514,807 B2
(45) Date of Patent: Dec. 6, 2016

(54) VARIABLE RESISTANCE MEMORY DEVICE

(71) Applicants: YounSeon Kang, Yongin-si (KR);
Jungdal Choi, Hwaseong-si (KR);
Masayuki Terai, Suwon-si (KR);
Youngbae Kim, Seoul (KR); Jung Moo Lee, Hwaseong (KR); Seungjae Jung, Suwon-si (KR)

(72) Inventors: YounSeon Kang, Yongin-si (KR);
Jungdal Choi, Hwaseong-si (KR);
Masayuki Terai, Suwon-si (KR);
Youngbae Kim, Seoul (KR); Jung Moo Lee, Hwaseong (KR); Seungjae Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/955,789

(22) Filed: Dec. 1, 2015

(65) Prior Publication Data
US 2016/0180929 A1    Jun. 23, 2016

(30) Foreign Application Priority Data
Dec. 18, 2014 (KR) ........................ 10-2014-0183287

(51) Int. Cl.
G11C 11/34 (2006.01)
G11C 13/00 (2006.01)
G11C 11/16 (2006.01)
G11C 8/00 (2006.01)
G11C 7/00 (2006.01)

(52) U.S. Cl.
CPC ............. *G11C 13/0004* (2013.01); *G11C 7/00* (2013.01); *G11C 8/00* (2013.01); *G11C 11/16* (2013.01)

(58) Field of Classification Search
CPC ............ G11C 11/16; G11C 7/00; G11C 8/00; G11C 5/06
USPC ................ 365/174, 148, 163, 158, 171, 173
See application file for complete search history.

(56) References Cited

U.S. PATENT DOCUMENTS

| 7,042,035 | B2 | 5/2006 | Rinerson et al. |
| 8,274,068 | B2 | 9/2012 | Nagashima |
| 8,502,322 | B2 | 8/2013 | Nitta |
| 8,644,069 | B2 | 2/2014 | Kamoshida |
| 8,648,467 | B2 | 2/2014 | Baba |
| 8,648,471 | B2 | 2/2014 | Tabata et al. |
| 8,753,973 | B2 | 6/2014 | Furuhashi |
| 2009/0134432 | A1* | 5/2009 | Tabata .................. G11C 13/00 257/211 |

(Continued)

FOREIGN PATENT DOCUMENTS

JP    2009283514 A    12/2009

*Primary Examiner* — Han Yang
(74) *Attorney, Agent, or Firm* — Myers Bigel, P.A.

(57) ABSTRACT

A variable resistance memory device includes upper interconnections on a substrate, first and second word lines provided between the substrate and the upper interconnections and vertically spaced apart from each other, a first bit line disposed between the first and second word lines and intersecting the first and second word lines, memory cells provided in an intersecting region of the first word line and the first bit line and an intersecting region of the second word line and the first bit line, a first word line contact directly connecting the first word line to a corresponding one of the upper interconnections, and a second word line contact directly connecting the second word line to a corresponding one of the upper interconnections.

20 Claims, 16 Drawing Sheets

(56) References Cited

U.S. PATENT DOCUMENTS

| | | | |
|---|---|---|---|
| 2009/0141532 A1* | 6/2009 | Nagashima | G11C 5/02 365/51 |
| 2011/0286254 A1* | 11/2011 | Yu | G11C 5/063 365/51 |
| 2012/0007167 A1 | 1/2012 | Hung et al. | |
| 2013/0249113 A1 | 9/2013 | Baba | |
| 2014/0085961 A1 | 3/2014 | Kanamori et al. | |
| 2014/0355326 A1* | 12/2014 | Okawa | G11C 13/0002 365/63 |

\* cited by examiner

VARIABLE RESISTANCE MEMORY DEVICE

CROSS-REFERENCE TO RELATED APPLICATION

This U.S. non-provisional patent application claims priority under 35 U.S.C. §119 to Korean Patent Application No. 10-2014-0183287, filed on Dec. 18, 2014, in the Korean Intellectual Property Office, the disclosure of which is hereby incorporated by reference herein in its entirety.

BACKGROUND

The inventive concepts relate to semiconductor devices, and more particularly, to variable resistance memory devices.

Next generation semiconductor memory devices (e.g., ferroelectric random access memory (FRAM), magnetic RAM (MRAM), phase-change RAM (PRAM), and/or resistive RAM (RRAM)) have been developed to improve performance and reduce power consumption of semiconductor memory devices. Resistances of materials used in the next generation semiconductor memory devices may be changed according to a current or a voltage, and the next generation semiconductor memory devices may retain their stored resistance values even when their power (e.g., currents or voltage) are interrupted. Memory devices including resistive memory cells that are three-dimensionally arranged are being developed to improve integration densities of the next generation semiconductor memory devices.

SUMMARY

Embodiments of the inventive concepts may provide variable resistance memory devices capable of reducing manufacture costs.

Embodiments of the inventive concepts may also provide variable resistance memory devices capable of being easily manufactured.

According to some embodiments, a memory device includes upper interconnections on a substrate, and memory cells and peripheral circuits between a surface of the substrate and the upper interconnections. The upper interconnections are electrically coupled to the peripheral circuits, and the memory cells are switchable between different resistance states. Word lines and bit lines are alternately stacked between the surface of the substrate and the upper interconnections, and respective ones of the memory cells are at respective intersections of the word lines and bit lines. Conductive contacts electrically couple respective ones of the upper interconnections to respective ones of the word lines and/or bit lines. The conductive contacts comprise respective unitary members connecting top surfaces of the respective ones of the word lines and/or bit lines to bottom surfaces of the respective ones of the upper interconnections.

In some embodiments, the conductive contacts may independently connect the respective ones of the word lines and/or bit lines to the respective ones of the upper interconnections, and may be electrically isolated from remaining ones of the word lines and/or bit lines.

In some embodiments, the conductive contacts may extend in a direction perpendicular to the surface of the substrate. The conductive contacts may be confined between the bottom surfaces of the respective ones of the upper interconnections and the top surfaces of the respective ones of the word lines and/or bit lines, and may be in direct contact therewith.

In some embodiments, the respective ones of the word lines and/or bit lines may be of different lengths and may be stacked in the direction perpendicular to the surface of the substrate in order of decreasing length such that the top surfaces thereof are at different distances from the surface of the substrate.

In some embodiments, the bottom surfaces of the respective ones of the upper interconnections may be at a same distance from the surface of the substrate.

In some embodiments, the conductive contacts may electrically couple the respective ones of the word lines to a first one of the peripheral circuits and/or may electrically couple the respective ones of the bit lines to a second one of the peripheral circuits through the respective ones of the upper connections.

In some embodiments, the conductive contacts may be portions of a same conductive material.

In some embodiments, the upper interconnections may be the same conductive material.

In some embodiments, the first and second peripheral circuits may be beneath the memory cells and/or laterally adjacent thereto.

In some embodiments, the word lines and the bit lines may have different thicknesses.

In some embodiments, the memory cells may define an array, and ones of the conductive contacts on a same side of the array may extend on alternating ones of the word lines or on alternating ones of the bit lines. The alternating ones of the word lines or the alternating ones of the bit lines may be on coplanar surfaces.

In some embodiments, the memory cells may define an array, and ones of the conductive contacts on a same side of the array may extend on alternating ones of the word lines or on alternating ones of the bit lines. The alternating ones of the word lines or the alternating ones of the bit lines may be stacked in a direction perpendicular to the surface of the substrate.

In one aspect, a variable resistance memory device may include: upper interconnections provided on a substrate; a first word line and a second word line provided between the substrate and the upper interconnections, the first and second word lines spaced apart from each other in a direction perpendicular to a top surface of the substrate; a first bit line disposed between the first word line and the second word line, the first bit line intersecting the first and second word lines; memory cells provided in an intersecting region of the first word line and the first bit line and an intersecting region of the second word line and the first bit line; a first word line contact directly connecting the first word line to a corresponding one of the upper interconnections; and a second word line contact directly connecting the second word line to a corresponding one of the upper interconnections. The first word line may be connected to a first peripheral circuit through the first word line contact and the upper interconnection connected to the first word line contact, and the second word line may be connected to the first peripheral circuit through the second word line contact and the upper interconnection connected to the second word line contact.

In an embodiment, levels of bottom surfaces of the first and second word line contacts from the substrate may be higher than those of bottom surfaces of the first and second word lines from the substrate, respectively.

In an embodiment, top surfaces of the first and second word line contacts may be disposed at the same level from the substrate.

In an embodiment, the first and second word line contacts may include the same material.

In an embodiment, bottom surfaces of the upper interconnections may be disposed at the same level as the top surfaces of the first and second word line contacts.

In an embodiment, the upper interconnections and the first and second word line contacts may include the same material.

In an embodiment, the first word line may be disposed at a lower level than the second word line, and the first word line contact may be in contact with an end portion of the first word line. The end portion of the first word line may not overlap with the second word line when viewed from a plan view.

In an embodiment, the first word line and the second word line may extend in parallel to each other in a first direction parallel to the top surface of the substrate, and the second word line may overlap with a portion of the first word line when viewed from a plan view.

In an embodiment, the second word line contact may be in contact with an end portion of the second word line, and the first and second word line contacts may be disposed at one side of a memory cell array including the memory cells when viewed from a plan view.

In an embodiment, the second word line contact may be in contact with an end portion of the second word line, and the memory cells may constitute a memory cell array. The first word line contact and the second word line contact may be spaced apart from each other in the first direction with the memory cell array interposed therebetween.

In an embodiment, the variable resistance memory device may further include: a second bit line provided between the substrate and the upper interconnections, the second bit line spaced apart from the first bit line with the second word line interposed therebetween in the direction perpendicular to the top surface of the substrate; a first bit line contact directly connecting the first bit line to a corresponding one of the upper interconnections; and a second bit line contact directly connecting the second bit line to a corresponding one of the upper interconnections. The memory cells may further include: a memory cell provided in an intersecting region of the second word line and the second bit line. The first bit line may be connected to a second peripheral circuit through the first bit line contact and the upper interconnection connected to the first bit line contact, and the second bit line may be connected to the second peripheral circuit through the second bit line contact and the upper interconnection connected to the second bit line contact.

In an embodiment, levels of bottom surfaces of the first and second bit line contacts from the substrate may be higher than those of bottom surfaces of the first and second bit lines from the substrate, respectively.

In an embodiment, top surfaces of the first and second word line contacts and top surfaces of the first and second bit line contacts may be disposed at the same level from the substrate.

In an embodiment, the first and second word line contacts and the first and second bit line contacts may include the same material.

In an embodiment, bottom surfaces of the upper interconnections may be disposed at the same level as the top surfaces of the first and second word line contacts and the top surfaces of the first and second bit line contacts.

In an embodiment, the upper interconnections, the first and second word line contacts, and the first and second bit line contacts may include the same material.

In an embodiment, the first bit line may be disposed at a lower level than the second bit line. The first bit line contact may be in contact with an end portion of the first bit line, and the end portion of the first bit line may not overlap with the second bit line when viewed from a plan view.

In an embodiment, the first and second word lines may extend in parallel to each other in a first direction parallel to the top surface of the substrate, and the first and second bit lines may extend in parallel to each other in a second direction parallel to the top surface of the substrate and intersecting the first direction. The second bit line may overlap with a portion of the first bit line when viewed from a plan view.

In an embodiment, the second bit line contact may be in contact with an end portion of the second bit line, and the first and second bit line contacts may be disposed at one side of a memory cell array including the memory cells when viewed from a plan view.

In an embodiment, the second bit line contact may be in contact with an end portion of the second bit line, and the memory cells may constitute a memory cell array. The first bit line contact and the second bit line contact may be spaced apart from each other in the second direction with the memory cell array interposed therebetween when viewed from a plan view.

In another aspect, a variable resistance memory device may include: upper interconnections provided on a substrate; a first word line and a second word line provided between the substrate and the upper interconnections, the first and second word lines spaced apart from each other in a direction perpendicular to a top surface of the substrate; a first bit line disposed between the first word line and the second word line, the first bit line intersecting the first and second word lines; memory cells provided in an intersecting region of the first word line and the first bit line and an intersecting region of the second word line and the first bit line; a first word line contact directly connecting the first word line to a corresponding one of the upper interconnections; a second word line contact directly connecting the second word line to a corresponding one of the upper interconnections; and a first bit line contact directly connecting the first bit line to a corresponding one of the upper interconnections. Top surfaces of the first word line contact, the second word line contact and the first bit line contact may be disposed at the same level from the substrate, and bottom surfaces of the first word line contact, the second word line contact and the first bit line contact may be disposed at different levels from each other.

In an embodiment, the variable resistance memory device may further include: a peripheral circuit applying a predetermined voltage or current to each of the first word line, the second word line and the first bit line. The first word line may be connected to the peripheral circuit through the first word line contact and the upper interconnection connected to the first word line contact, and the second word line may be connected to the peripheral circuit through the second word line contact and the upper interconnection connected to the second word line contact. The first bit line may be connected to the peripheral circuit through the first bit line contact and the upper interconnection connected to the first bit line contact.

In an embodiment, the peripheral circuit may be provided between the substrate and a memory cell array including the memory cells, and the peripheral circuit and the memory cell array may be vertically stacked on the substrate.

In an embodiment, the first word line contact, the second word line contact, and the first bit line contact may include the same material.

In an embodiment, the first word line may be disposed at a lower level than the second word line. The second word line may extend in parallel to the first word line and may overlap with the first word line when viewed from a plan view. The first word line contact may be in contact with an end portion of the first word line, and the end portion of the first word line may not overlap with the second word line when viewed from a plan view.

In an embodiment, the second word line contact may be in contact with an end portion of the second word line, and the first and second word line contacts may be disposed at one side of a memory cell array including the memory cells when viewed from a plan view.

In an embodiment, the second word line contact may be in contact with an end portion of the second word line. When viewed from a plan view, the first word line contact may be disposed at one side of a memory cell array including the memory cells and the second word line contact may be disposed at another side of the memory cell array opposite to the one side.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
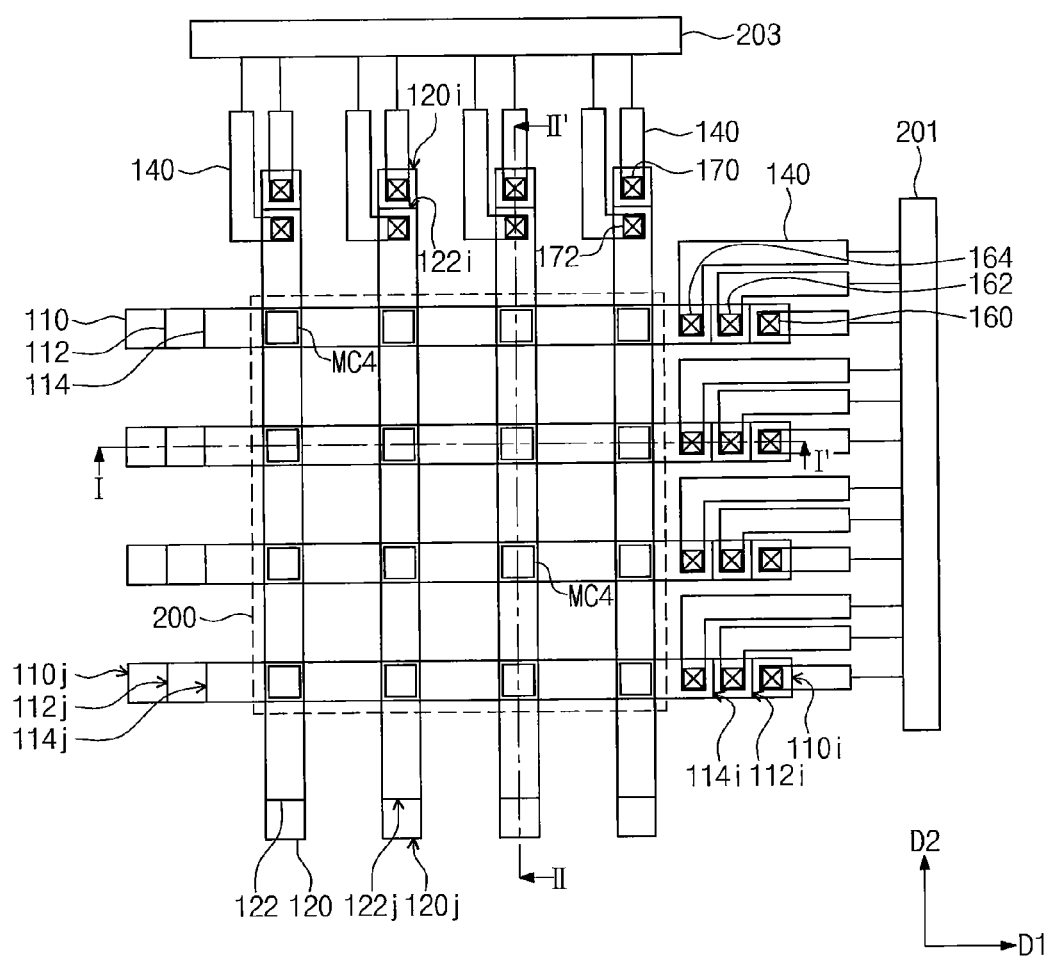
FIG. 1 is a plan view illustrating a variable resistance memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device. Devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits. Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
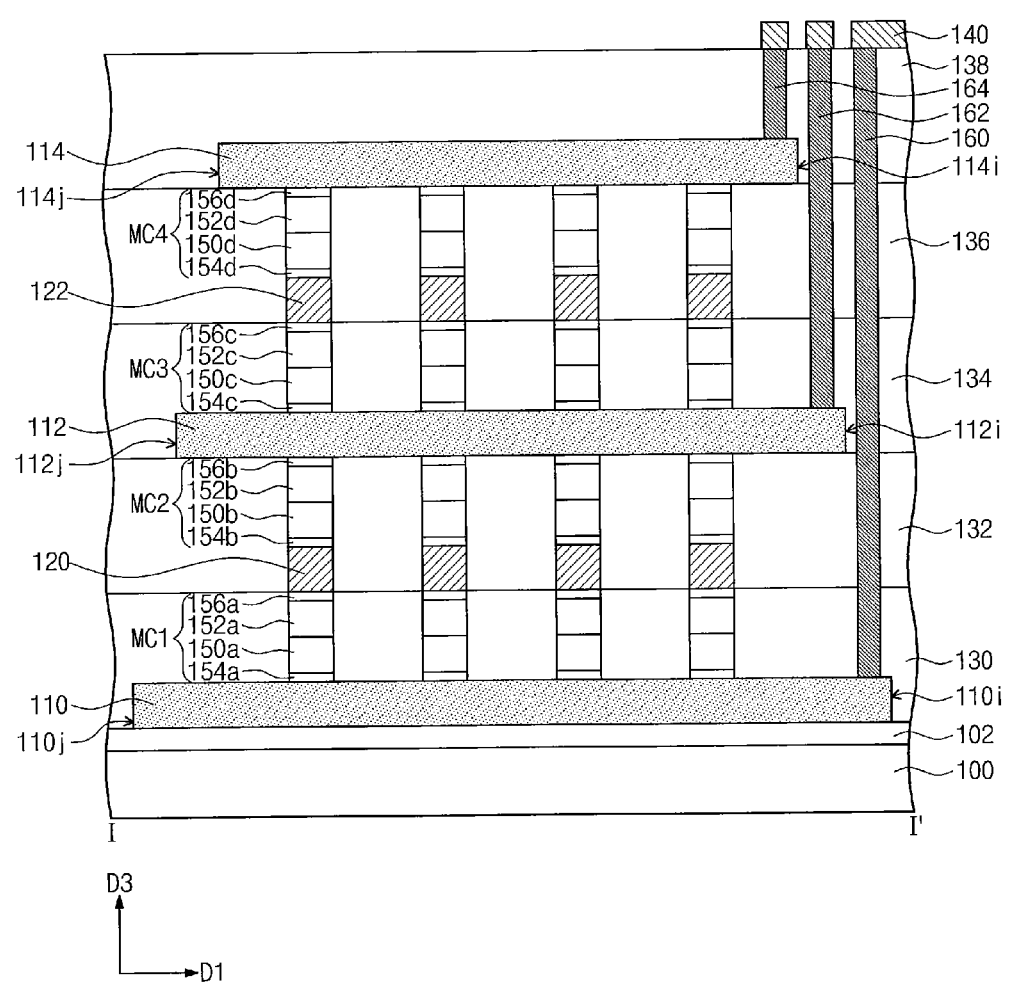
FIG. 2 is a cross-sectional view taken along a line I-I' of FIG. 1.
Figure 3:
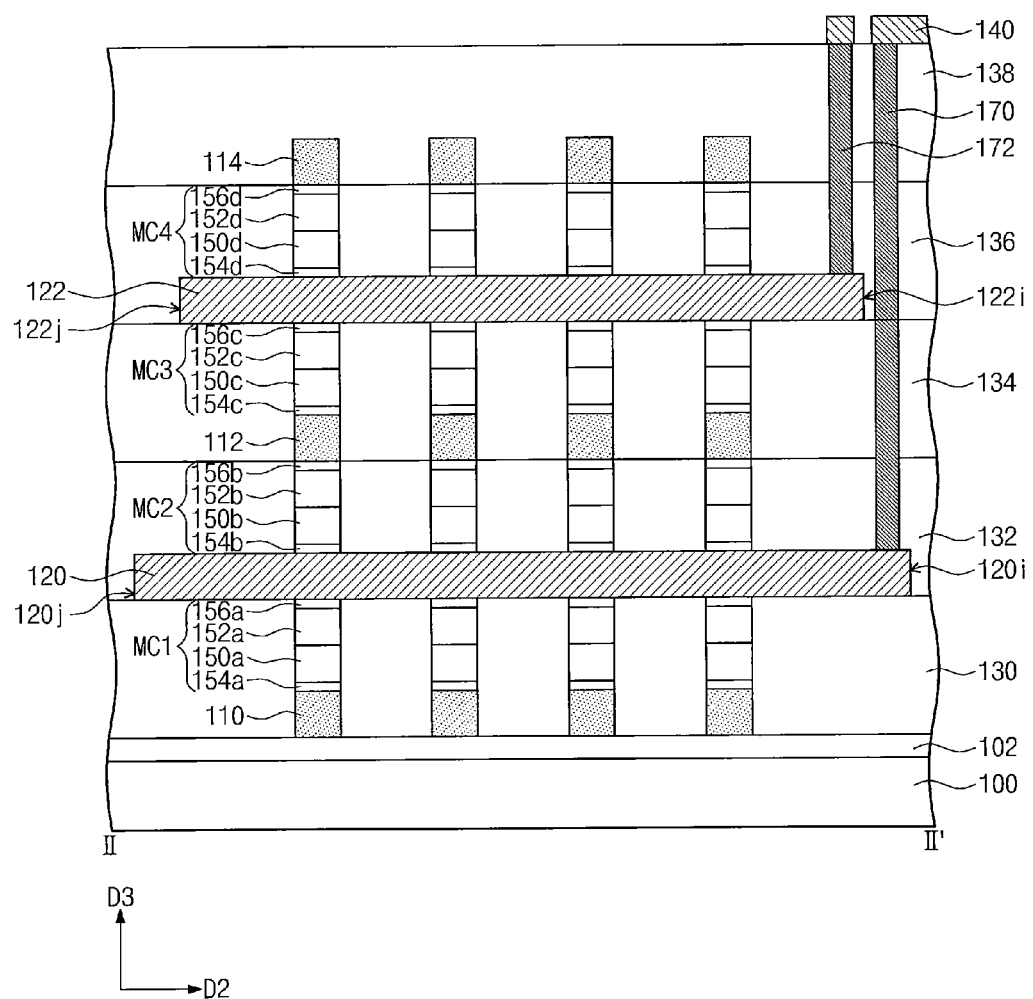
FIG. 3 is a cross-sectional view taken along a line II-II' of FIG. 1.
Figure 4:
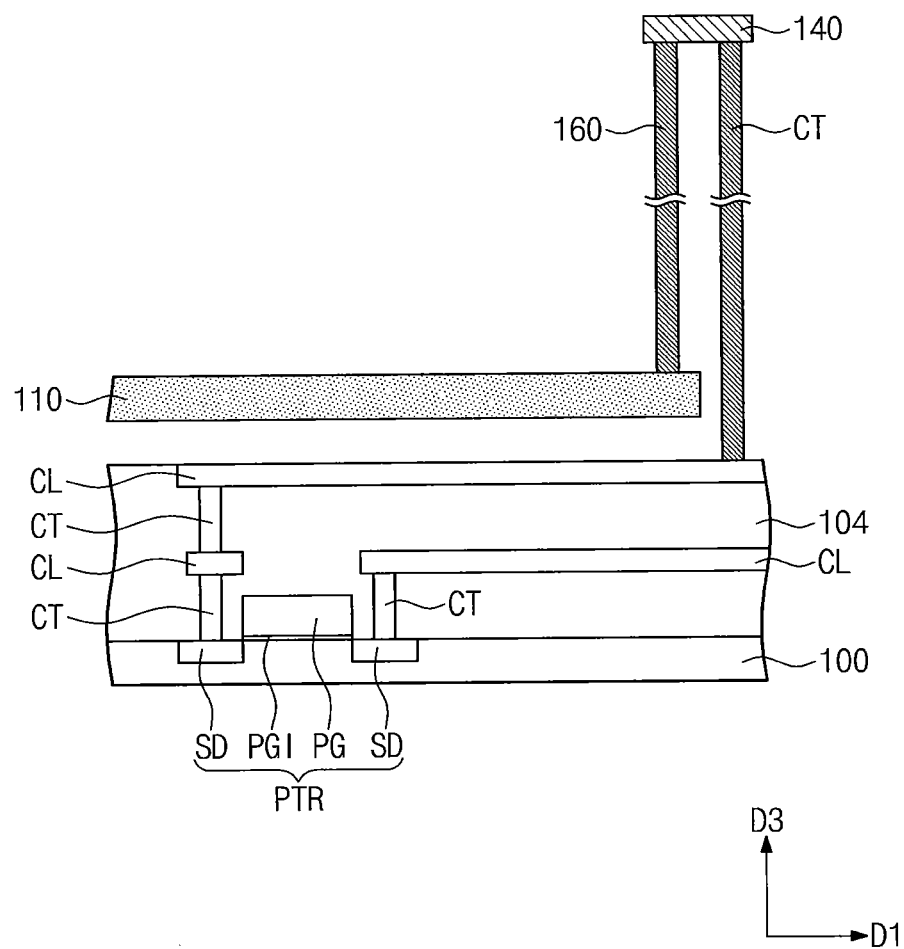
FIG. 4 is a schematic cross-sectional view illustrating an embodiment of arrangement of first and second peripheral circuits of FIG. 1.
Figure 5:
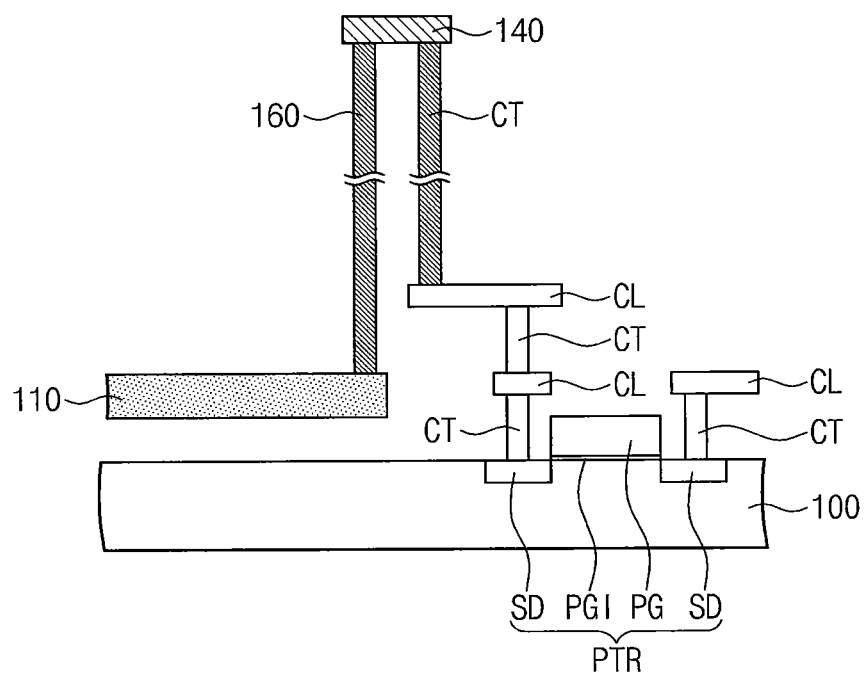
FIG. 5 is a schematic cross-sectional view illustrating another embodiment of arrangement of first and second peripheral circuits of FIG. 1.

FIG. 1 is a plan view illustrating a variable resistance memory device according to example embodiments of the inventive concepts. FIG. 2 is a cross-sectional view taken along a line I-I' of FIG. 1, and FIG. 3 is a cross-sectional view taken along a line II-II' of FIG. 1. FIG. 4 is a schematic cross-sectional view illustrating an embodiment of arrangement of first and second peripheral circuits of FIG. 1. FIG. 5 is a schematic cross-sectional view illustrating another embodiment of arrangement of first and second peripheral circuits of FIG. 1.

Referring to FIGS. 1 to 3, first word lines 110 may be provided on a substrate 100. The first word lines 110 may extend in a first direction D1 and may be spaced apart from each other in a second direction D2 intersecting the first direction D1. The first and second directions D1 and D2 may be parallel to a top surface of the substrate 100. An insulating layer 102 may be provided between the substrate 100 and the first word lines 110 to insulate the first word lines 110 from the substrate 100. The substrate 100 may be a semiconductor substrate such as a silicon wafer. The insulating layer 102 may include at least one of an oxide layer (e.g., a silicon oxide layer), a nitride layer (e.g., a silicon nitride layer), or an oxynitride layer (e.g., a silicon oxynitride layer).

A first interlayer insulating layer 130 may be provided on the first word lines 110 and the insulating layer 102. The first interlayer insulating layer 130 may extend onto or cover the first word lines 110. The first interlayer insulating layer 130 may include at least one of an oxide layer (e.g., a silicon oxide layer), a nitride layer (e.g., a silicon nitride layer), or an oxynitride layer (e.g., a silicon oxynitride layer).

First bit lines 120 intersecting the first word lines 110 may be provided on the first interlayer insulating layer 130. The first bit lines 120 may extend in the second direction D2 and may be spaced apart from each other in the first direction D1. The first bit lines 120 may be spaced apart from the first word lines 110 in a third direction D3 perpendicular to the first and second directions D1 and D2. The third direction D3 may be perpendicular to the top surface of the substrate 100.

First memory cells MC1 may be respectively provided in intersecting regions of the first word lines 110 and the first bit lines 120 in the first interlayer insulating layer 130. Each of the first memory cells MC1 may include a first selection element 150a and a first data storage layer 152a that are stacked in the third direction D3. Each of the first memory cells MC1 may further include a first lower electrode 154a connected to the first selection element 150a and a first upper electrode 156a connected to the first data storage layer 152a. In each of the first memory cells MC1, the first lower electrode 154a, the first selection element 150a, the first data storage layer 152a, and the first upper electrode 156a may be vertically stacked in the order named or in reverse order.

In some embodiments, as illustrated in FIGS. 2 and 3, the first selection element 150a may be provided between the first data storage layer 152a and a corresponding one of the first word lines 110, and the first data storage layer 152a may be provided between the first selection element 150a and a corresponding one of the first bit lines 120. The first lower electrode 154a may be provided between the first selection element 150a and the corresponding first word line 110, and the first upper electrode 156a may be provided between the first data storage layer 152a and the corresponding first bit line 120. In other embodiments, in contrast with FIGS. 2 and 3, the first selection element 150a may be provided between the first data storage layer 152a and the corresponding first bit line 120, and the first data storage layer 152a may be provided between the first selection element 150a and the corresponding first word line 110. In this case, the first lower electrode 154a may be provided between the first selection element 150a and the corresponding first bit line 120, and the first upper electrode 156a may be provided between the first data storage layer 152a and the corresponding first word line 110.

The first selection element 150a may have an island shape that is confined in the intersecting region of the corresponding first word line 110 and the corresponding first bit line 120. The first selection element 150a may have, for example, an asymmetrical current-voltage property or a rectifying property, so a current passing through each of the first memory cells MC1 may more easily flow in one direction. In other words, the current may mainly flow upward or downward by the first selection element 150a in each of the first memory cells MC1. In other embodiments, the first selection element 150a may include a nonlinear resistor that has a resistance value changed according to a magnitude of a voltage applied thereto. For example, if the resistance value of the nonlinear resistor is reversely proportional to the magnitude of the applied voltage, the nonlinear resistor of a selected cell supplied with a relatively high voltage may have a low-resistance value to allow a current flow, but the nonlinear resistor of an unselected cell supplied with a relatively low voltage may have a high-resistance value not to allow a current flow.

In some embodiments, the first selection element 150a may be a silicon diode or an oxide diode which has the rectifying property. For example, the first selection element 150a may include a silicon diode having P-type silicon and N-type silicon connected to each other. Alternatively, the first selection element 150a may include an oxide diode having P-type nickel oxide (p-NiO$_x$) and N-type titanium oxide (n-TiO$_x$) connected to each other, or an oxide diode having P-type copper oxide (p-CuO$_x$) and N-type titanium oxide (n-TiO$_x$) connected to each other. In other embodiments, the first selection element 150a may include a specific oxide (e.g., ZnOx, MgOx, or AlOx), a resistance value of which is high during supply of a first voltage lower than a specific or threshold voltage but is low during supply of a second voltage equal to or higher than the specific or threshold voltage. In other words, if the first voltage is applied to the specific oxide, a current may not flow through the specific oxide. On the contrary, if the second voltage is applied to the specific oxide, the current may flow through the specific oxide.

In some embodiments, the first data storage layer 152a may have an island shape that is confined in the intersecting region of the corresponding first word line 110 and the corresponding first bit line 120. However, the inventive concepts are not limited thereto. In other embodiments, in contrast with FIGS. 2 and 3, the first data storage layer 152a may have a line shape extending in a direction parallel to the top surface of the substrate 100. If the first data storage layer 152a is provided between the first selection element 150a and the corresponding first bit line 120, the first data storage layer 152a may extend along the corresponding first bit line 120 in the second direction D2 and may be shared by a plurality of the first memory cells MC1 arranged in the second direction D2. Alternatively, if the first data storage layer 152a is provided between the first selection element 150a and the corresponding first word line 110, the first data storage layer 152a may extend along the corresponding first word line 110 in the first direction D1 and may be shared by a plurality of the first memory cells MC1 arranged in the first direction D1.

The resistance state of the first data storage layer 152a may be changed into one of two or more stable resistance states by a voltage or a current applied thereto. In addition, the resistance state of the first data storage layer 152a may be maintained unless external power is supplied to the data storage layer 152a. Thus, the resistance value of each of the first memory cells MC1 may be stored as data, and the first memory cells MC1 may have a non-volatile characteristic.

In some embodiments, the first data storage layer 152a may include a material, a resistance of which becomes low by a current path generated by supplying a high voltage. For example, the first data storage layer 152a may include a metal oxide (e.g., TiO$_x$, HfO$_x$, TaO$_x$, NiO$_x$, ZrO$_x$, or WO$_x$), a metal nitride (e.g., BN$_x$ or AlN$_x$), an oxide having perovskite structure (e.g., PrCaMnO or doped-SrTiO), or a solid electrolyte including a well diffused metal ion (e.g., Cu or Ag). For example, the solid electrolyte may include GeTe or GeS. In these embodiments, the first memory cells MC1 may be called 'resistive random access memory (RRAM) cells'.

In other embodiments, the first data storage layer 152a may include a phase-change material, a phase of which is changeable between an amorphous state and a crystalline state according to a temperature and a supply time of heat generated by a current or voltage applied thereto. In this case, the first memory cells MC1 may be called 'phase-change random access memory (PRAM) cells'. The phase-change material may include a chalcogenide, a phase of which is changeable between a crystalline state (a low-resistance state) and an amorphous state (a high-resistance state) by Joule's heat generated by a current or voltage applied thereto. In an embodiment, the first data storage layer 152a may be heated at a temperature higher than a melting point of the phase-change material by a reset current supplied for a short time, and then the data storage layer 152a may be rapidly cooled. In this case, the first data storage layer 152a may have the amorphous high-resistance state (e.g., a reset state). A set current may be applied to the first data storage layer 152a of the high-resistance state for a long time to maintain the first data storage layer 152a at a temperature lower than the melting point and higher than a crystallization temperature of the phase-change material, and then the first data storage layer 152a may be cooled. Thus, the high-resistance state of the first data storage layer 152a may be switched into the crystalline low-resistance state (e.g., a set state). A current passing through the first data storage layer 152a may be sensed to read information data stored in the first memory cell MC1.

In still other embodiments, the first data storage layer 152a may include a magnetic structure including two ferromagnetic layers. An electrical resistance of the magnetic structure may be changed depending on magnetization directions of the two ferromagnetic layers. If the magnetization directions of the two ferromagnetic layers are parallel to each other, the first data storage layer 152a may have a low-resistance state. If the magnetization directions of the two ferromagnetic layers are anti-parallel to each other, the first data storage layer 152a may have a high-resistance state. In an embodiment, the first data storage layer 152a may include a giant magnetoresistance (GMR) structure including the two ferromagnetic layers and a non-magnetic conductor interposed between the two ferromagnetic layers. In another embodiment, the first data storage layer 152a may include a magnetic tunnel junction (MTJ) structure including the two ferromagnetic layers and a non-magnetic insulator interposed between the two ferromagnetic layers. For example, the ferromagnetic layers may include CoFe, NiFe, or NiFeCo, and the non-magnetic conductor may include chrome (Cr) or copper (Cu). The non-magnetic insulator may include MgO$_x$ or AlO$_x$. In this case, the first memory cells MC1 may be called 'magnetic random access memory (MRAM) cells'.

In some embodiments, the first lower electrode 154a may have an island shape that is confined in the intersecting region of the corresponding first word line 110 and the corresponding first bit line 120. However, the inventive concepts are not limited thereto. In other embodiments, in contrast with FIGS. 2 and 3, the first lower electrode 154a may have a line shape extending in a direction parallel to the top surface of the substrate 100. If the first lower electrode 154a is provided between the first selection element 150a and the corresponding first word line 110, the first lower electrode 154a may extend along the corresponding first word line 110 in the first direction D1 and may be shared by a plurality of the first memory cells MC1 arranged in the first direction D1. Alternatively, if the first lower electrode 154a is provided between the first selection element 150a and the corresponding first bit line 120, the first lower electrode 154a may extend along the corresponding first bit line 120 in the second direction D2 and may be shared by a plurality of the first memory cells MC1 arranged in the second direction D2. The first lower electrode 154a may include a conductive material. For example, the first lower electrode 154a may include at least one of a noble metal (e.g., Pt, Ir, or Ru), TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, TaON, Al, or W.

In some embodiments, the first upper electrode 156a may have an island shape that is confined in the intersecting region of the corresponding first word line 110 and the corresponding first bit line 120. However, the inventive concepts are not limited thereto. In other embodiments, in contrast with FIGS. 2 and 3, the first upper electrode 156a may have a line shape extending in a direction parallel to the top surface of the substrate 100. If the first upper electrode 156a is provided between the first data storage layer 152a and the corresponding first bit line 120, the first upper electrode 156a may extend along the corresponding first bit line 120 in the second direction D2 and may be shared by a plurality of the first memory cells MC1 arranged in the second direction D2. Alternatively, if the first upper electrode 156a is provided between the first data storage layer 152a and the corresponding first word line 110, the first upper electrode 156a may extend along the corresponding first word line 110 in the first direction D1 and may be shared by a plurality of the first memory cells MC1 arranged in the first direction D1. The first upper electrode 156a may include a conductive material. For example, the first upper electrode 156a may include at least one of a noble metal (e.g., Pt, Ir, or Ru), TiN, TaN, WN, Al, or W.

A second interlayer insulating layer 132 may be provided on the first interlayer insulating layer 130 and the first bit lines 120. The second interlayer insulating layer 132 may extend onto or cover the first bit lines 120. The second interlayer insulating layer 132 may include at least one of an oxide layer (e.g., a silicon oxide layer), a nitride layer (e.g., a silicon nitride layer), or an oxynitride layer (e.g., a silicon oxynitride layer).

Second word lines 112 may be provided on the second interlayer insulating layer 132. The second word lines 112 may extend in parallel to the first word lines 110 and may intersect the first bit lines 120. The second word lines 112 may extend in the first direction D1 and may be spaced apart from each other in the second direction D2. The second word lines 112 may be spaced apart from the first bit lines 120 in the third direction D3. The second word lines 112 may overlap with the first word lines 110, respectively, when viewed from a plan view.

Second memory cells MC2 may be respectively provided in intersecting regions of the first bit lines 120 and the second word lines 112 in the second interlayer insulating layer 132. The second memory cells MC2 may overlap with the first memory cells MC1, respectively, when viewed from a plan view. Each of the second memory cells MC2 may include a second selection element 150b and a second data storage layer 152b that are stacked in the third direction D3. Each of the second memory cells MC2 may further include a second lower electrode 154b connected to the second selection element 150b and a second upper electrode 156b connected to the second data storage layer 152b. In each of the second memory cells MC2, the second lower electrode 154b, the second selection element 150b, the second data storage layer 152b, and the second upper electrode 156b may be vertically stacked in the order named or in reverse order.

In some embodiments, as illustrated in FIGS. 2 and 3, the second selection element 150b may be provided between the second data storage layer 152b and a corresponding one of the first bit lines 120, and the second data storage layer 152b may be provided between the second selection element 150b and a corresponding one of the second word lines 112. The second lower electrode 154b may be provided between the second selection element 150b and the corresponding first bit line 120, and the second upper electrode 156b may be provided between the second data storage layer 152b and the corresponding second word line 112. In other embodiments, in contrast with FIGS. 2 and 3, the second selection element 150b may be provided between the second data storage layer 152b and the corresponding second word line 112, and the second data storage layer 152b may be provided between the second selection element 150b and the corresponding first bit line 120. In this case, the second lower electrode 154b may be provided between the second selection element 150b and the corresponding second word line 112, and the second upper electrode 156b may be provided between the second data storage layer 152b and the corresponding first bit line 120.

The second selection element 150b may have an island shape that is confined in the intersecting region of the corresponding first bit line 120 and the corresponding second word line 112. The second selection element 150b may include the same material as the first selection element 150a.

In some embodiments, the second data storage layer 152b may have an island shape that is confined in the intersecting region of the corresponding first bit line 120 and the corresponding second word line 112. However, the inventive concepts are not limited thereto. In other embodiments, in contrast with FIGS. 2 and 3, the second data storage layer 152b may have a line shape extending in a direction parallel to the top surface of the substrate 100. If the second data storage layer 152b is provided between the second selection element 150b and the corresponding second word line 112, the second data storage layer 152a may extend along the corresponding second word line 112 in the first direction D1 and may be shared by a plurality of the second memory cells MC2 arranged in the first direction D1. Alternatively, if the second data storage layer 152b is provided between the second selection element 150b and the corresponding first bit line 120, the second data storage layer 152b may extend along the corresponding first bit line 120 in the second direction D2 and may be shared by a plurality of the second memory cells MC2 arranged in the second direction D2. The second data storage layer 152b may include the same material as the first data storage layer 152a.

In some embodiments, the second lower electrode 154b may have an island shape that is confined in the intersecting region of the corresponding first bit line 120 and the corresponding second word line 112. However, the inventive concepts are not limited thereto. In other embodiments, in contrast with FIGS. 2 and 3, the second lower electrode 154b may have a line shape extending in a direction parallel to the top surface of the substrate 100. If the second lower electrode 154b is provided between the second selection element 150b and the corresponding first bit line 120, the second lower electrode 154b may extend along the corresponding first bit line 120 in the second direction D2 and may be shared by a plurality of the second memory cells MC2 arranged in the second direction D2. Alternatively, if the second lower electrode 154b is provided between the second selection element 150b and the corresponding second word line 112, the second lower electrode 154b may extend along the corresponding second word line 112 in the first direction D1 and may be shared by a plurality of the second memory cells MC2 arranged in the first direction D1. The second lower electrode 154b may include the same material as the first lower electrode 154a.

In some embodiments, the second upper electrode 156b may have an island shape that is confined in the intersecting region of the corresponding first bit line 120 and the corresponding second word line 112. However, the inventive concepts are not limited thereto. In other embodiments, in contrast with FIGS. 2 and 3, the second upper electrode 156b may have a line shape extending in a direction parallel to the top surface of the substrate 100. If the second upper electrode 156b is provided between the second data storage layer 152b and the corresponding second word line 112, the second upper electrode 156b may extend along the corresponding second word line 112 in the first direction D1 and may be shared by a plurality of the second memory cells MC2 arranged in the first direction D1. Alternatively, if the second upper electrode 156b is provided between the second data storage layer 152b and the corresponding first bit line 120, the second upper electrode 156b may extend along the corresponding first bit line 120 in the second direction D2 and may be shared by a plurality of the second memory cells MC2 arranged in the second direction D2. The second upper electrode 156b may include the same material as the first upper electrode 156a.

A third interlayer insulating layer 134 may be provided on the second interlayer insulating layer 132 and the second word lines 112. The third interlayer insulating layer 134 may extend onto or cover the second word lines 112. The third interlayer insulating layer 134 may include at least one of an oxide layer (e.g., a silicon oxide layer), a nitride layer (e.g., a silicon nitride layer), or an oxynitride layer (e.g., a silicon oxynitride layer).

Second bit lines 122 may be provided on the third interlayer insulating layer 134. The second bit lines 122 may extend in parallel to the first bit lines 120 and may intersect the second word lines 112. The second bit lines 122 may extend in the second direction D2 and may be spaced apart from each other in the first direction D1. The second bit lines 122 may be spaced apart from the second word lines 112 in the third direction D3. The second bit lines 122 may overlap with the first bit lines 120, respectively, when viewed from a plan view.

Third memory cells MC3 may be respectively provided in intersecting regions of the second word lines 112 and the second bit lines 122 in the third interlayer insulating layer 134. The third memory cells MC3 may overlap with the second memory cells MC2, respectively, when viewed from a plan view. Each of the third memory cells MC3 may include a third selection element 150c and a third data storage layer 152c that are stacked in the third direction D3. Each of the third memory cells MC3 may further include a third lower electrode 154c connected to the third selection element 150c and a third upper electrode 156c connected to the third data storage layer 152c. In each of the third memory cells MC3, the third lower electrode 154c, the third selection element 150c, the third data storage layer 152c, and the third upper electrode 156c may be vertically stacked in the order named or in reverse order.

In some embodiments, as illustrated in FIGS. 2 and 3, the third selection element 150c may be provided between the third data storage layer 152c and a corresponding one of the second word lines 112, and the third data storage layer 152c may be provided between the third selection element 150c and a corresponding one of the second bit lines 122. The third lower electrode 154c may be provided between the third selection element 150c and the corresponding second word line 112, and the third upper electrode 156c may be provided between the third data storage layer 152c and the corresponding second bit line 122. In other embodiments, in contrast with FIGS. 2 and 3, the third selection element 150c may be provided between the third data storage layer 152c and the corresponding second bit line 122, and the third data storage layer 152c may be provided between the third selection element 150c and the corresponding second word line 112. In this case, the third lower electrode 154c may be provided between the third selection element 150c and the corresponding second bit line 122, and the third upper electrode 156c may be provided between the third data storage layer 152c and the corresponding second word line 112.

Descriptions to shapes of the third lower electrode 154c, the third selection element 150c, the third data storage layer 152c and the third upper electrode 156c may be the substantially same as those to the shapes of the first lower electrode 154a, the first selection element 150a, the first data storage layer 152a and the first upper electrode 156a. In this case, the corresponding first word line 110 and the corresponding first bit line 120 may correspond to the corresponding second word line 112 and the corresponding second bit line 122, respectively, and the first memory cells MC1 may correspond to the third memory cells MC3. The third lower electrode 154c, the third selection element 150c, the third data storage layer 152c, and the third upper electrode 156c may include the same materials as the first lower electrode 154a, the first selection element 150a, the first data storage layer 152a, and the first upper electrode 156a, respectively.

A fourth interlayer insulating layer 136 may be provided on the third interlayer insulating layer 134 and the second bit lines 122. The fourth interlayer insulating layer 136 may extend onto or cover the second bit lines 122. The fourth interlayer insulating layer 136 may include at least one of an oxide layer (e.g., a silicon oxide layer), a nitride layer (e.g., a silicon nitride layer), or an oxynitride layer (e.g., a silicon oxynitride layer).

Third word lines 114 may be provided on the fourth interlayer insulating layer 136. The third word lines 114 may extend in parallel to the second word lines 112 and may intersect the second bit lines 122. The third word lines 114 may extend in the first direction D1 and may be spaced apart from each other in the second direction D2. The third word lines 114 may be spaced apart from the second bit lines 122 in the third direction D3. The third word lines 114 may overlap with the second word lines 112, respectively, when viewed from a plan view.

Fourth memory cells MC4 may be respectively provided in intersecting regions of the second bit lines 122 and the third word lines 114 in the fourth interlayer insulating layer 136. The fourth memory cells MC4 may overlap with the third memory cells MC3, respectively, when viewed from a plan view. Each of the fourth memory cells MC4 may include a fourth selection element 150d and a fourth data storage layer 152d that are stacked in the third direction D3. Each of the fourth memory cells MC4 may further include a fourth lower electrode 154d connected to the fourth selection element 150d and a fourth upper electrode 156d connected to the fourth data storage layer 152d. In each of the fourth memory cells MC4, the fourth lower electrode 154d, the fourth selection element 150d, the fourth data storage layer 152d, and the fourth upper electrode 156d may be vertically stacked in the order named or in reverse order.

In some embodiments, as illustrated in FIGS. 2 and 3, the fourth selection element 150d may be provided between the fourth data storage layer 152d and a corresponding one of the second bit lines 122, and the fourth data storage layer 152d may be provided between the fourth selection element 150d and a corresponding one of the third word lines 114. The fourth lower electrode 154d may be provided between the fourth selection element 150d and the corresponding second bit line 122, and the fourth upper electrode 156d may be provided between the fourth data storage layer 152d and the corresponding third word line 114. In other embodiments, in contrast with FIGS. 2 and 3, the fourth selection element 150d may be provided between the fourth data storage layer 152d and the corresponding third word line 114, and the fourth data storage layer 152d may be provided between the fourth selection element 150d and the corresponding second bit line 122. In this case, the fourth lower electrode 154d may be provided between the fourth selection element 150d and the corresponding third word line 114, and the fourth upper electrode 156d may be provided between the fourth data storage layer 152d and the corresponding second bit line 122.

Descriptions to shapes of the fourth lower electrode 154d, the fourth selection element 150d, the fourth data storage layer 152d and the fourth upper electrode 156d may be the substantially same as those to the shapes of the second lower electrode 154b, the second selection element 150b, the second data storage layer 152b and the second upper electrode 156b. In this case, the corresponding first bit line 120 and the corresponding second word line 112 may correspond to the corresponding second bit line 122 and the corresponding third word line 114, respectively, and the second memory cells MC2 may correspond to the fourth memory cells MC4. The fourth lower electrode 154d, the fourth selection element 150d, the fourth data storage layer 152d, and the fourth upper electrode 156d may include the same materials as the first lower electrode 154a, the first selection element 150a, the first data storage layer 152a, and the first upper electrode 156a, respectively.

In example embodiments of the inventive concepts, four-layered memory cells MC1, MC2, MC3, and MC4 sequentially stacked are illustrated as an example in FIGS. 1 to 3. However, the inventive concepts are not limited to the stack number of the memory cells MC1, MC2, MC3, and MC4, and fewer or more than four layers of memory cells may be provided.

The first to third word lines 110, 112, and 114 may include a conductive material. For example, the first to third word lines 110, 112, and 114 may include at least one of titanium (Ti), tungsten (W), silicon (Si), copper (Cu), tantalum (Ta), molybdenum (Mo), ruthenium (Ru), aluminum (Al), gold (Au), platinum (Pt), or silver (Ag). The first and second bit lines 120 and 122 may include a conductive material. For example, the first and second bit lines 120 and 122 may include at least one of Ti, W, Si, Cu, Ta, Mo, Ru, Al, Au, Pt, or Ag.

A fifth interlayer insulating layer 138 may be provided on the fourth interlayer insulating layer 136 and the third word lines 114. The fifth interlayer insulating layer 138 may extend onto or cover the third word lines 114. The fifth interlayer insulating layer 138 may include at least one of an oxide layer (e.g., a silicon oxide layer), a nitride layer (e.g., a silicon nitride layer), or an oxynitride layer (e.g., a silicon oxynitride layer).

Upper interconnections 140 may be provided on the fifth interlayer insulating layer 138. The upper interconnections 140 may include a conductive material. The upper interconnections 140 may be conductive lines that are disposed at the substantially same level or distance from the substrate 100.

First, second, and third word line contacts 160, 162, and 164 may be provided on the substrate 100. The first word line contact 160 may connect a respective one of the first word lines 110 to a corresponding one of the upper interconnections 140, and the second word line contact 162 may connect a respective one of the second word lines 112 to a corresponding one of the upper interconnections 140. The third word line contact 164 may connect a respective one of the third word lines 114 to a corresponding one of the upper interconnections 140.

The first word line contact 160 may penetrate or extend through the first to fifth interlayer insulating layers 130, 132, 134, 136 and 138 to directly connect a respective one of the first word lines 110 to the upper interconnection 140 corresponding thereto. A level of a bottom surface of the first word line contact 160 may be higher than that of a bottom surface of each of the first word lines 110, relative to the substrate. In an embodiment, the bottom surface of the first word line contact 160 may be in contact with a top surface of a respective one of the first word lines 110. A top surface of the first word line contact 160 may be in contact with a bottom surface of the upper interconnection 140 connected thereto. The second word line contact 162 may penetrate or extend through the third to fifth interlayer insulating layers 134, 136 and 138 to directly connect a respective one of the second word lines 112 to the upper interconnection 140 corresponding thereto. A level of a bottom surface of the second word line contact 162 may be higher than that of a bottom surface of each of the second word lines 112. In an embodiment, the bottom surface of the second word line contact 162 may be in contact with a top surface of a respective one of the second word lines 112. A top surface of the second word line contact 162 may be in contact with a bottom surface of the upper interconnection 140 connected thereto. The third word line contact 164 may penetrate or extend through the fifth interlayer insulating layer 138 to directly connect a respective one of the third word lines 114 to the upper interconnection 140 corresponding thereto. A level of a bottom surface of the third word line contact 164 may be higher than that of a bottom surface of a respective one of the third word lines 114. In an embodiment, the bottom surface of the third word line contact 164 may be in contact with a top surface of a respective one of the third word lines 114. A top surface of the third word line contact 164 may be in contact with a bottom surface of the upper interconnection 140 connected thereto. Each of the first to third word line contacts 160, 162 and 164 may be formed as a unitary member or in one body extending in the third direction D3.

The top surfaces of the first to third word line contacts 160, 162 and 164 may be disposed at the substantially same level or distance from the substrate 100. The bottom surfaces of the first to third word line contacts 160, 162 and 164 may be disposed at different levels or distances from each other. In other words, the level of the bottom surface of the first word line contact 160 may be lower than that of the bottom surface of the second word line contact 162, and the level of the bottom surface of the second word line contact 162 may be lower than that of the bottom surface of the third word line contact 164.

Each of the first word lines 110 may have a first sidewall 110i and a second sidewall 110j opposite to each other in the first direction D1. Each of the second word lines 112 may have a third sidewall 112i and a fourth sidewall 112j opposite to each other in the first direction D1. Each of the third word lines 114 may have a fifth sidewall 114i and a sixth sidewall 114j opposite to each other in the first direction D1. The first sidewall 110i, the third sidewall 112i, and the fifth sidewall 114i may be provided at a first side of a memory cell array 200 including the memory cells MC1, MC2, MC3 and MC4. The second sidewall 110j, the fourth sidewall 112j, and the sixth sidewall 114j may be provided at a second side of the memory cell array 200. The first side and the second side of the memory cell array 200 may be opposite to each other in the first direction D1.

The first sidewall 110i of each of the first word lines 110 may be spaced apart from the third sidewall 112i of each of the second word lines 112 in the first direction D1 when viewed from a plan view, so each of the first word lines 110 may have an end portion not overlapping with each of the second word lines 112. The first word line contact 160 may be provided on the end portion of a respective one of the first word lines 110. The first word line contact 160 may be in contact with a top surface of the end portion of a respective one of the first word lines 110 but may not be in contact with the first sidewall 110i. Likewise, the third sidewall 112i of each of the second word lines 112 may be spaced apart from the fifth sidewall 114i of each of the third word lines 114 in the first direction D1 when viewed from a plan view, so each of the second word lines 112 may have an end portion not overlapping with each of the third word lines 114. The second word line contact 162 may be provided on the end portion of a respective one of the second word lines 112. The second word line contact 162 may be in contact with a top surface of the end portion of a respective one of the second word lines 112 but may not be in contact with the third sidewall 112i. The third word line contact 164 may be provided on an end portion of a respective one of the third word lines 114. The third word line contact 164 may be adjacent to the fifth sidewall 114i of a respective one of the third word lines 114. The third word line contact 164 may be in contact with a top surface of the end portion of a respective one of the third word lines 114 but may not be in contact with the fifth sidewall 114i.

In some embodiments, the first to third word line contacts 160, 162 and 164 may be provided at the first side of the memory cell array 200, as illustrated in FIG. 1.

The first to third word line contacts 160, 162 and 164 may include a conductive material. The first to third word line contacts 160, 162 and 164 may include the same material as each other. In some embodiments, the first to third word line contacts 160, 162 and 164 may include the same material as the upper interconnections 140.

Each of the first word lines 110 may be connected to a first peripheral circuit 201 through the first word line contact 160 and the upper interconnection 140 connected to the first word line contact 160. Each of the second word lines 112 may be connected to the first peripheral circuit 201 through the second word line contact 162 and the upper interconnection 140 connected to the second word line contact 162. Each of the third word lines 114 may be connected to the first peripheral circuit 201 through the third word line contact 164 and the upper interconnection 140 connected to the third word line contact 164. The first peripheral circuit 201 may supply a predetermined voltage or current to each of the first to third word lines 110, 112 and 114.

First and second bit line contacts 170 and 172 may be provided on the substrate 100. The first bit line contact 170 may connect a respective one of the first bit lines 120 to a corresponding one of the upper interconnections 140, and the second bit line contact 172 may connect a respective one of the second bit lines 122 to a corresponding one of the upper interconnections 140. The bit line contacts 170, 172 (more generally referred to herein as conductive contacts) may each be a unitary member or structure extending in the third direction D3.

The first bit line contact 170 may penetrate or extend through the second to fifth interlayer insulating layers 132, 134, 136 and 138 to directly connect a respective one of the first bit lines 120 to the upper interconnection 140 corresponding thereto. A level of a bottom surface of the first bit line contact 170 may be higher than that of a bottom surface of each of the first bit lines 120. In an embodiment, the bottom surface of the first bit line contact 170 may be in contact with a top surface of a respective one of the first bit lines 120. A top surface of the first bit line contact 170 may be in contact with a bottom surface of the upper interconnection 140 connected thereto. The second bit line contact 172 may penetrate or extend through the fourth and fifth interlayer insulating layers 136 and 138 to directly connect a respective one of the second bit lines 122 to the upper interconnection 140 corresponding thereto. A level of a bottom surface of the second bit line contact 172 may be higher than that of a bottom surface of each of the second bit lines 122. In an embodiment, the bottom surface of the second bit line contact 172 may be in contact with a top surface of a respective one of the second bit lines 122. A top surface of the second bit line contact 172 may be in contact with a bottom surface of the upper interconnection 140 connected thereto. Each of the first and second bit line contacts 170 and 172 may be formed as a unitary member or in one body extending in the third direction D3.

The top surfaces of the first and second bit line contacts 170 and 172 may be disposed at the substantially same level or distance from the substrate 100. The bottom surfaces of the first and second bit line contacts 170 and 172 may be disposed at different levels or distances from each other. In other words, the level of the bottom surface of the first bit line contact 170 may be lower than that of the bottom surface of the second bit line contact 172.

Each of the first bit lines 120 may have a seventh sidewall 120i and an eighth sidewall 120j opposite to each other in the second direction D2. Each of the second bit lines 122 may have a ninth sidewall 122i and a tenth sidewall 122j opposite to each other in the second direction D2. The seventh sidewall 120i and the ninth sidewall 122i may be provided at a third side of the memory cell array 200, and the eighth sidewall 120j and the tenth sidewall 122j may be provided at a fourth side of the memory cell array 200. The third side and the fourth side of the memory cell array 200 may be opposite to each other in the second direction D2.

The seventh sidewall 120i of each of the first bit lines 120 may be spaced apart from the ninth sidewall 122i of each of the second bit lines 122 in the second direction D2 when viewed from a plan view, so each of the first bit lines 120 may have an end portion not overlapping with each of the second bit lines 122. The first bit line contact 170 may be provided on the end portion of each of the first bit lines 120. The first bit line contact 170 may be in contact with a top surface of the end portion of a respective one of the first bit lines 120 but may not be in contact with the seventh sidewall 120i. The second bit line contact 172 may be provided on an end portion of a respective one of the second bit lines 122. The second bit line contact 172 may be adjacent to the ninth sidewall 122i of a respective one of the second bit lines 122. The second bit line contact 172 may be in contact with a top surface of the end portion of a respective one of the second bit lines 122 but may not be in contact with the ninth sidewall 122i.

In some embodiments, the first and second bit line contacts 170 and 172 may be provided at the third side of the memory cell array 200, as illustrated in FIG. 1.

The first and second bit line contacts 170 and 172 may include a conductive material. The first and second bit line contacts 170 and 172 may include the same material as each other. In some embodiments, the first and second bit line contacts 170 and 172 may include the same material as the upper interconnections 140.

The first and second bit line contacts 170 and 172 may include the same material as the first to third word line contacts 160, 162 and 164. In an embodiment, the first to third word line contacts 160, 162 and 164, the first and second bit line contacts 170 and 172, and the upper interconnections 140 may include the same material as each other.

Each of the first bit lines 120 may be connected to a second peripheral circuit 203 through the first bit line contact 170 and the upper interconnection 140 connected to the first bit line contact 170. Each of the second bit lines 122 may be connected to the second peripheral circuit 203 through the second bit line contact 172 and the upper interconnection 140 connected to the second bit line contact 172. The second peripheral circuit 203 may supply a predetermined voltage or current to each of the first and second bit lines 120 and 122.

Hereinafter, arrangements of the first and second peripheral circuits 201 and 203 will be described with reference to FIGS. 4 and 5. For the purpose of ease and convenience in explanation, the first word lines 110 will be described as an example. However, the second and third word lines 112 and 114 and the first and second bit lines 120 and 122 may have structures corresponding to a structure of the first word lines 110 described below.

Referring to FIGS. 1 to 5, each of the first and second peripheral circuits 201 and 203 may include at least one peripheral transistor PTR. The peripheral transistor PTR may include a peripheral gate insulating pattern PGI and a peripheral gate electrode PG sequentially stacked on the substrate 100, and source/drain regions SD provided in the substrate 100 at both sides of the peripheral gate electrode PG. The peripheral gate insulating pattern PGI may include, for example, silicon oxide. The peripheral gate electrode PG may include, for example, a doped semiconductor material and/or a metal material.

According to some embodiments, the peripheral transistor PTR may be provided in a lower insulating layer 104 disposed between the substrate 100 and the insulating layer 102, as illustrated in FIG. 4. The lower insulating layer 104 may include at least one of a silicon oxide layer or a silicon nitride layer. In a cross-sectional view, the peripheral transistor PTR may be disposed under the memory cell array 200. In other words, the variable resistance memory device according to some embodiments of the inventive concepts may include the peripheral transistor PTR and the memory cell array 200 which are vertically stacked on the substrate 100. Conductive lines CL and contacts CT may be provided in the lower insulating layer 104. The conductive lines CL and the contacts CT may be used to connect the peripheral transistor PTR to a corresponding one of the upper interconnections 140. Each of the first word lines 110 may be electrically connected to the peripheral transistor PTR of the first peripheral circuit 201 through the first word line contact 160 and the upper interconnection 140 connected to the first word line contact 160. The upper interconnection 140 connected to the first word line contact 160 may be electrically connected to the peripheral transistor PTR of the first peripheral circuit 201 through the conductive lines CL and the contacts CT. In this case, one of the contacts CT, which is in direct contact with the upper interconnection 140 connected to the first word line contact 160, may include the same material as the first word line contact 160.

According to other embodiments, the peripheral transistor PTR may be provided on the substrate 100 at the periphery of the memory cell array 200, as illustrated in FIG. 5. The peripheral transistor PTR may be disposed at a side of the memory cell array 200. In other words, the variable resistance memory device according to other embodiments of the inventive concepts may include the peripheral transistor PTR and the memory cell array 200 which are laterally spaced apart from each other on the substrate 100. Conductive lines CL and contacts CT for connecting the peripheral transistor PTR to a corresponding one of the upper interconnections 140 may be provided on the substrate 100. Each of the first word lines 110 may be electrically connected to the peripheral transistor PTR of the first peripheral circuit 201 through a respective first word line contact 160 and the upper interconnection 140 connected to the first word line contact 160. The upper interconnection 140 connected to the first word line contact 160 may be electrically connected to the peripheral transistor PTR of the first peripheral circuit 201 through the conductive lines CL and the contacts CT. In this case, one of the contacts CT, which is in direct contact with the upper interconnection 140 connected to the first word line contact 160, may include the same material as the first word line contact 160. In some embodiments, the word line contact 160 and the one of the contacts CT directly connected to a same upper interconnection 140 may each be a single, unitary member.

Figure 6A:
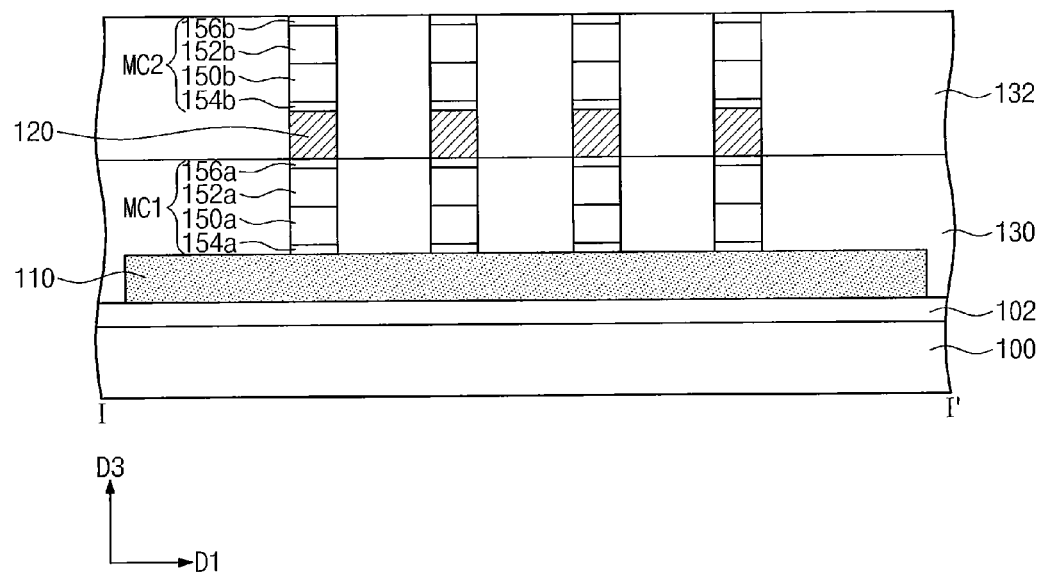
FIGS. 6A and 7A are cross-sectional views corresponding to the line I-I' of FIG. 1 to illustrate a method of manufacturing the variable resistance memory device according to example embodiments of the inventive concepts.
Figure 6B:
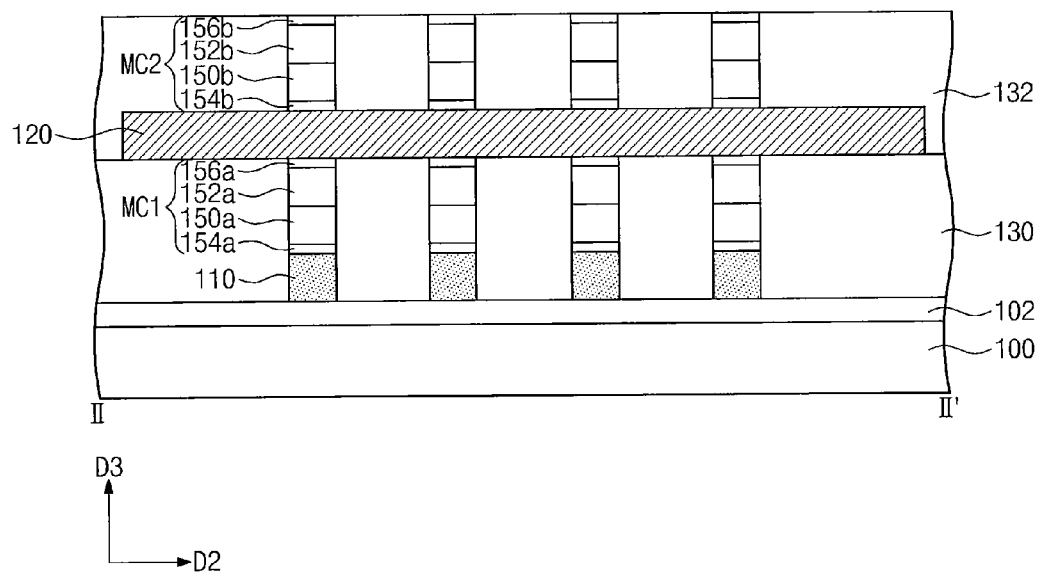
FIGS. 6B and 7B are cross-sectional views corresponding to the line II-II' of FIG. 1 to illustrate methods of manufacturing the variable resistance memory device according to example embodiments of the inventive concepts.
Figure 7A:
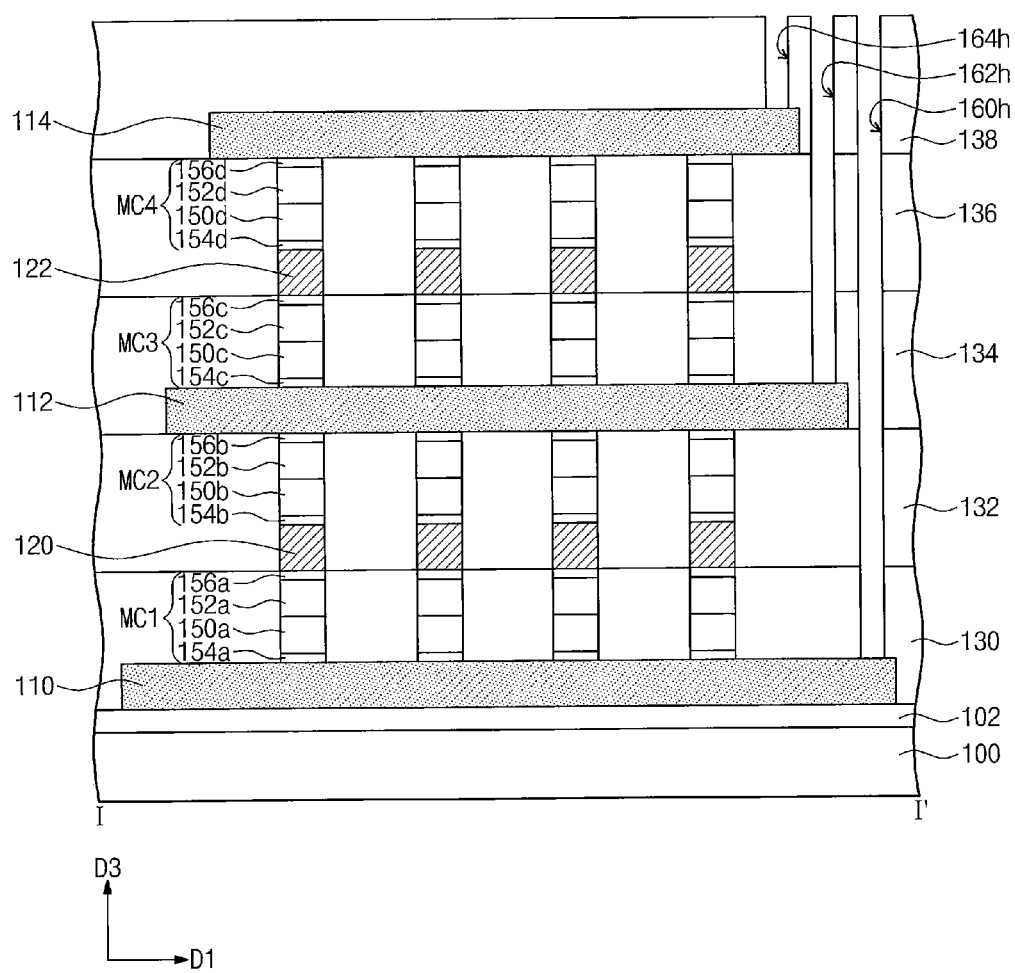
Figure 7B:
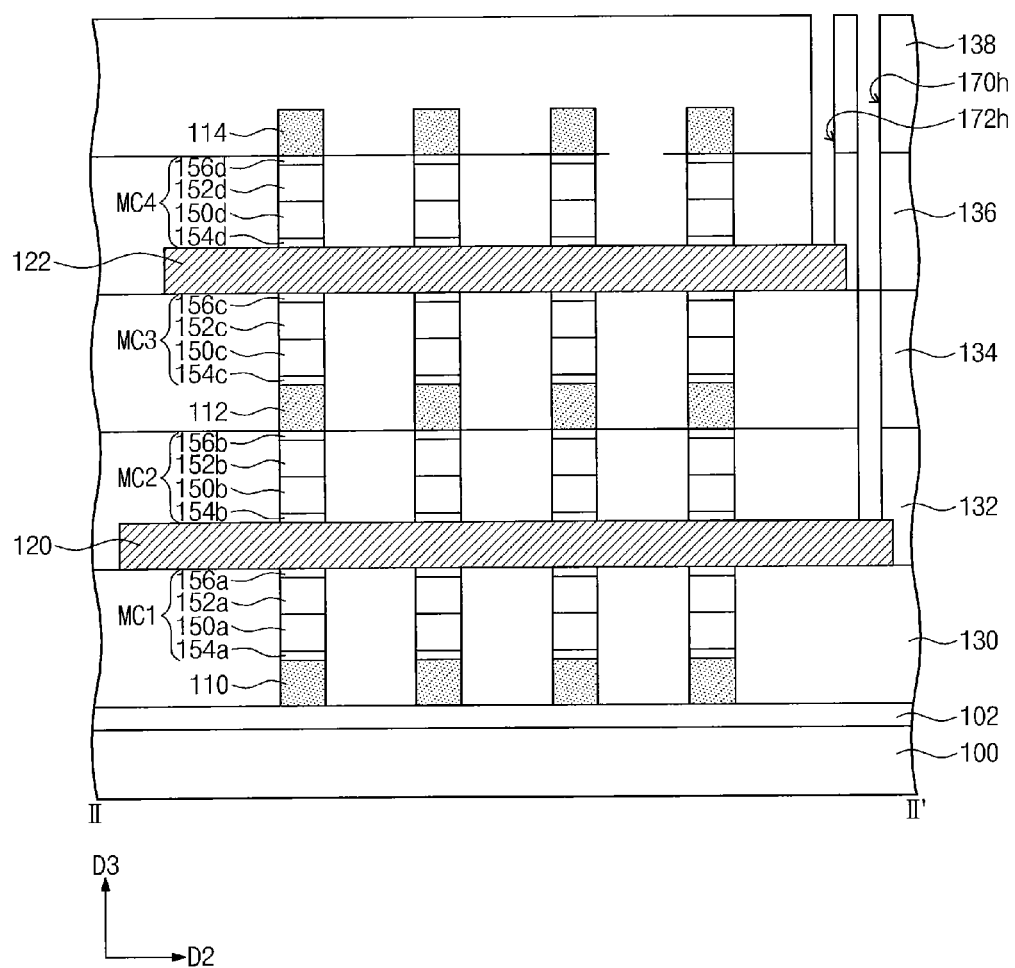

FIGS. 6A and 7A are cross-sectional views corresponding to the line I-I' of FIG. 1 to illustrate a method of manufacturing the variable resistance memory device according to example embodiments of the inventive concepts. FIGS. 6B and 7B are cross-sectional views corresponding to the line II-IP of FIG. 1 to illustrate a method of manufacturing the variable resistance memory device according to example embodiments of the inventive concepts.

Referring to FIGS. 6A and 6B, an insulating layer 102 may be formed on a substrate 100. The substrate 100 may be a semiconductor substrate such as a silicon wafer. The insulating layer 102 may be formed by depositing at least one of an oxide layer (e.g., a silicon oxide layer), a nitride layer (e.g., a silicon nitride layer), or an oxynitride layer (e.g., a silicon oxynitride layer). First word lines 110 that extend in the first direction D1 and are spaced apart from each other in the second direction D2 may be formed on the insulating layer 102. A conductive layer may be deposited on the insulating layer 102, and the deposited conductive layer may be patterned to form the first word lines 110. A first interlayer insulating layer 130 may be formed on the first word lines 110 and the insulating layer 102. The first interlayer insulating layer 130 may extend onto or cover the first word lines 110. The first interlayer insulating layer 130 may be formed by depositing at least one of an oxide layer (e.g., a silicon oxide layer), a nitride layer (e.g., a silicon nitride layer), or an oxynitride layer (e.g., a silicon oxynitride layer).

First memory cells MC1 connected to the first word lines 110 may be formed in the first interlayer insulating layer 130. Each of the first memory cells MC1 may include a first lower electrode 154a, a first selection element 150a, a first data storage layer 152a, and a first upper electrode 156a which are sequentially stacked.

In some embodiments, forming the first memory cells MC1 may include sequentially depositing a first lower electrode layer, a first selection element layer, a first data storage layer, and a first upper electrode layer on the substrate 100 having the first word lines 110, and sequentially patterning the first upper electrode layer, the first data storage layer, the first selection element layer and the first lower electrode layer to form the first upper electrode 156a, the first data storage layer 152a, the first selection element 150a and the first lower electrode 154a. In this case, the first interlayer insulating layer 130 may be formed on the substrate 100 having the first memory cells MC1, and then the first interlayer insulating layer 130 may be planarized until top surfaces of the first memory cells MC1 are exposed.

First bit lines 120 intersecting the first word lines 110 may be formed on the first interlayer insulating layer 130. The first bit lines 120 may extend in the second direction D2 and may be spaced apart from each other in the first direction D1. A conductive layer may be deposited on the first interlayer insulating layer 130 in which the first memory cells MC1 are formed, and the deposited conductive layer may be patterned to form the first bit lines 120. The first memory cells MC1 may be disposed in intersecting regions of the first word lines 110 and the first bit lines 120, respectively. A second interlayer insulating layer 132 extending onto or covering the first bit lines 120 may be formed on the first bit lines 120 and the first interlayer insulating layer 130. The second interlayer insulating layer 132 may be formed by depositing at least one of an oxide layer (e.g., a silicon oxide layer), a nitride layer (e.g., a silicon nitride layer), or an oxynitride layer (e.g., a silicon oxynitride layer).

Second memory cells MC2 connected to the first bit lines 120 may be formed in the second interlayer insulating layer 132. Each of the second memory cells MC2 may include a second lower electrode 154b, a second selection element 150b, a second data storage layer 152b, and a second upper electrode 156b which are sequentially stacked. The second memory cells MC2 may be formed by the substantially same method as the first memory cells MC1. Further, the second interlayer insulating layer 132 may be formed on the substrate 100 having the second memory cells MC2, and then the second interlayer insulating layer 132 may be planarized until top surfaces of the second memory cells MC2 are exposed.

Referring to FIGS. 7A and 7B, second word lines 112 parallel to the first word lines 110 may be formed on the second interlayer insulating layer 132. The second word lines 112 may intersect the first bit lines 120. The second word lines 112 may extend in the first direction D1 and may be spaced apart from each other in the second direction D2. The second word lines 112 may be formed using the substantially same method as the first word lines 110. The second memory cells MC2 may be disposed in intersecting regions of the first bit lines 120 and the second word lines 112, respectively. A third interlayer insulating layer 134 extending onto or covering the second word lines 112 may be formed on the second word lines 112 and the second interlayer insulating layer 132. The third interlayer insulating layer 134 may be formed by depositing at least one of an oxide layer (e.g., a silicon oxide layer), a nitride layer (e.g., a silicon nitride layer), or an oxynitride layer (e.g., a silicon oxynitride layer).

Third memory cells MC3 connected to the second word lines 112 may be formed in the third interlayer insulating layer 134. Each of the third memory cells MC3 may include a third lower electrode 154c, a third selection element 150c, a third data storage layer 152c, and a third upper electrode 156c which are sequentially stacked. A forming method of the third memory cells MC3 may be the substantially same as that of the first memory cells MC1. Further, the third interlayer insulating layer 134 may be formed on the substrate 100 having the third memory cells MC3, and then the third interlayer insulating layer 134 may be planarized until top surfaces of the third memory cells MC3 are exposed.

Second bit lines 122 which are parallel to the first bit lines 120 and intersect the second word lines 112 may be formed on the third interlayer insulating layer 134. The second bit lines 122 may extend in the second direction D2 and may be spaced apart from each other in the first direction D1. The second bit lines 122 may be formed by the same method as the first bit lines 120. The third memory cells MC3 may be disposed in intersecting regions of the second word lines 112 and the second bit lines 122, respectively. A fourth interlayer insulating layer 136 extending onto or covering the second bit lines 122 may be formed on the second bit lines 122 and the third interlayer insulating layer 134. The fourth interlayer insulating layer 136 may be formed by depositing at least one of an oxide layer (e.g., a silicon oxide layer), a nitride layer (e.g., a silicon nitride layer), or an oxynitride layer (e.g., a silicon oxynitride layer).

Fourth memory cells MC4 connected to the second bit lines 122 may be formed in the fourth interlayer insulating layer 136. Each of the fourth memory cells MC4 may include a fourth lower electrode 154d, a fourth selection element 150d, a fourth data storage layer 152d, and a fourth upper electrode 156d which are sequentially stacked. A forming method of the fourth memory cells MC4 may be the substantially same as that of the first memory cells MC1. Further, the fourth interlayer insulating layer 136 may be formed on the substrate 100 having the fourth memory cells MC4, and then the fourth interlayer insulating layer 136 may be planarized until top surfaces of the fourth memory cells MC4 are exposed.

Third word lines 114 which are parallel to the second word lines 112 and intersect the second bit lines 122 may be formed on the fourth interlayer insulating layer 136. The third word lines 114 may extend in the first direction D1 and may be spaced apart from each other in the second direction D2. The third word lines 114 may be formed using the substantially same method as the first word lines 110. The fourth memory cells MC4 may be disposed in intersecting regions of the second bit lines 122 and the third word lines 114, respectively. A fifth interlayer insulating layer 138 extending onto or covering the third word lines 114 may be formed on the third word lines 114 and the fourth interlayer insulating layer 136. The fifth interlayer insulating layer 138 may be formed by depositing at least one of an oxide layer (e.g., a silicon oxide layer), a nitride layer (e.g., a silicon nitride layer), or an oxynitride layer (e.g., a silicon oxynitride layer).

First, second and third word line contact holes 160h, 162h and 164h may be formed. The first word line contact hole 160h may penetrate or extend through the first to fifth interlayer insulating layers 130, 132, 134, 136 and 138 to expose a top surface of a respective one of the first word lines 110, and the second word line contact hole 162h may penetrate or extend through the third to fifth interlayer insulating layers 134, 136 and 138 to expose a top surface of each of the second word lines 112. The third word line contact hole 164h may penetrate or extend through the fifth interlayer insulating layer 138 to expose a top surface of a respective one of the third word lines 114. In addition, first and second bit line contact holes 170h and 172h may be formed. The first bit line contact hole 170h may penetrate or extend through the second to fifth interlayer insulating layers 132, 134, 136 and 138 to expose a top surface of a respective one of the first bit lines 120, and the second bit line contact hole 172h may penetrate or extend through the fourth and fifth interlayer insulating layers 136 and 138 to expose a top surface of a respective one of the second bit lines 122.

The first to third word line contact holes 160h, 162h and 164h and the first and second bit line contact holes 170h and 172h may be formed at the same time or in a same fabrication operation by performing a patterning process on the fifth interlayer insulating layer 138. The first to third word line contact holes 160h, 162h and 164h and the first and second bit line contact holes 170h and 172h may be formed using an etching process having an etch selectivity with respect to the materials of the first to third word lines 110, 112 and 114 and the first and second bit lines 120 and 122. In some embodiments, each of the first to third word lines 110, 112 and 114 and the first and second bit lines 120 and 122 may further include an etch stop material that acts as an etch stop layer during the etching process. The etch stop material may be disposed in an upper portion of each of the first to third word lines 110, 112 and 114 and the first and second bit lines 120 and 122. In other embodiments, thicknesses of the first to third word lines 110, 112 and 114 and the first and second bit lines 120 and 122 in the third direction D3 may be different from each other to increase a process margin of the etching process when the contact holes 160h, 162h, 164h, 170h and 172h having different depths from each other are formed at the same time or in a same fabrication operation.

Referring again to FIGS. 1 to 3, first to third word line contacts 160, 162 and 164 and first and second bit line contacts 170 and 172 may be formed in the first to third word line contact holes 160h, 162h and 164h and the first and second bit line contact holes 170h and 172h, respectively. Upper interconnections 140 may be formed on the fifth interlayer insulating layer 138, and each of the contacts 160, 162, 164, 170 and 172 may be connected to a corresponding one of the upper interconnections 140.

According to some embodiments, forming the contacts 160, 162, 164, 170 and 172 may include forming a conductive layer filling the contact holes 160h, 162h, 164h, 170h and 172h on the fifth interlayer insulating layer 138, and planarizing the conductive layer until a top surface of the fifth interlayer insulating layer 138 is exposed. Thereafter, the upper interconnections 140 may be formed on the fifth interlayer insulating layer 138. Forming the upper interconnections 140 may include forming an upper interconnection layer on the fifth interlayer insulating layer 138 in which the contacts 160, 162, 164, 170 and 172 are formed, and patterning the upper interconnection layer.

According to other embodiments, the contacts 160, 162, 164, 170 and 172 and the upper interconnections 140 may be formed using a damascene process at the same time or in a same fabrication operation. For example, sacrificial patterns (not shown) may be formed in the contact holes 160h, 162h, 164h, 170h and 174h, respectively. Thereafter, an upper insulating layer (not shown) may be formed on the fifth interlayer insulating layer 138, and the upper insulating layer (not shown) may be patterned to form openings (not shown) defining the upper interconnections 140. The contact holes 160h, 162h, 164h, 170h and 174h may be respectively connected to corresponding ones of the openings. The sacrificial patterns in the contact holes 160h, 162h, 164h, 170h and 174h may be exposed by the openings. The sacrificial patterns may be removed, so the contact holes 160h, 162h, 164h, 170h and 174h may be connected to the corresponding openings, respectively. Next, a conductive layer may be deposited on the upper insulating layer to fill the contact holes 160h, 162h, 164h, 170h and 174h and the openings. The deposited conductive layer may be planarized until a top surface of the upper insulating layer is exposed, thereby forming the contacts 160, 162, 164, 170 and 172 and the upper interconnections 140 at the same time or in a same fabrication operation. That is, one or more of the conductive contacts 160, 162, 164, 170, and/or 172, and the respective upper interconnections 140 thereon, may be defined by a unitary member that is formed from the same conductive layer.

Figure 8:
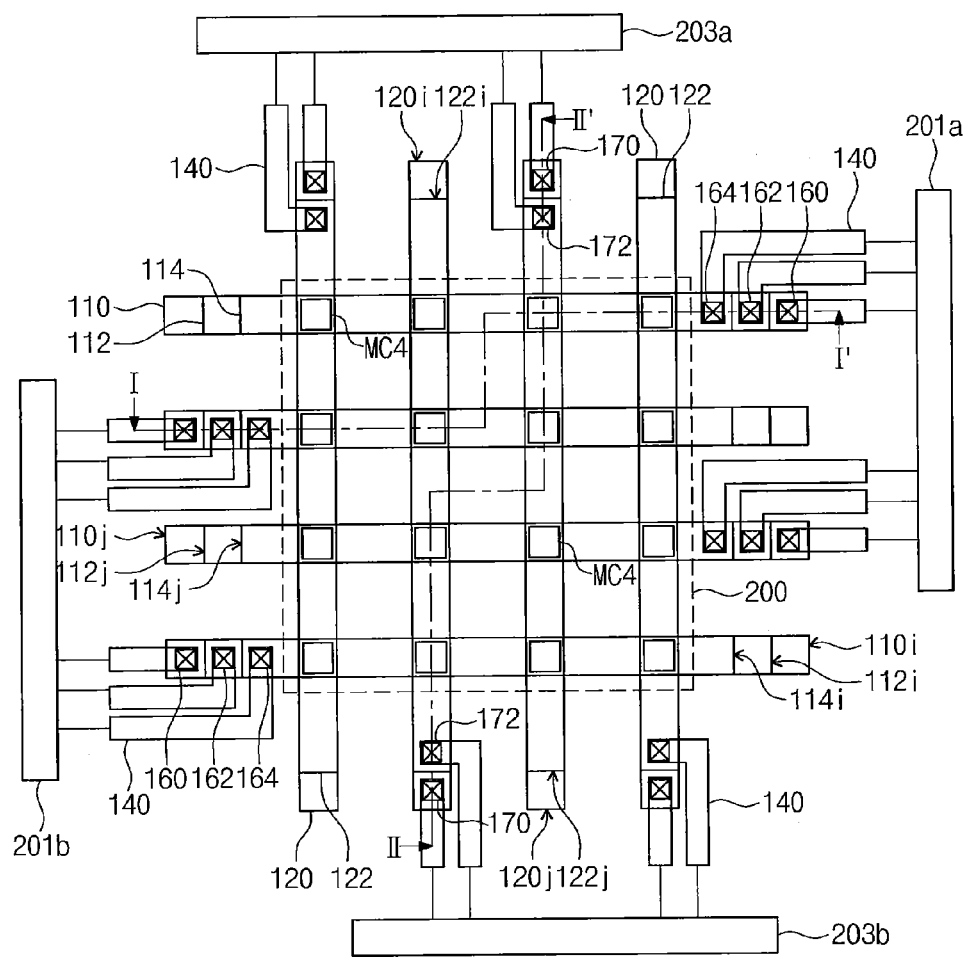
FIG. 8 is a plan view illustrating a variable resistance memory device according to further example embodiments of the inventive concepts.
Figure 9:
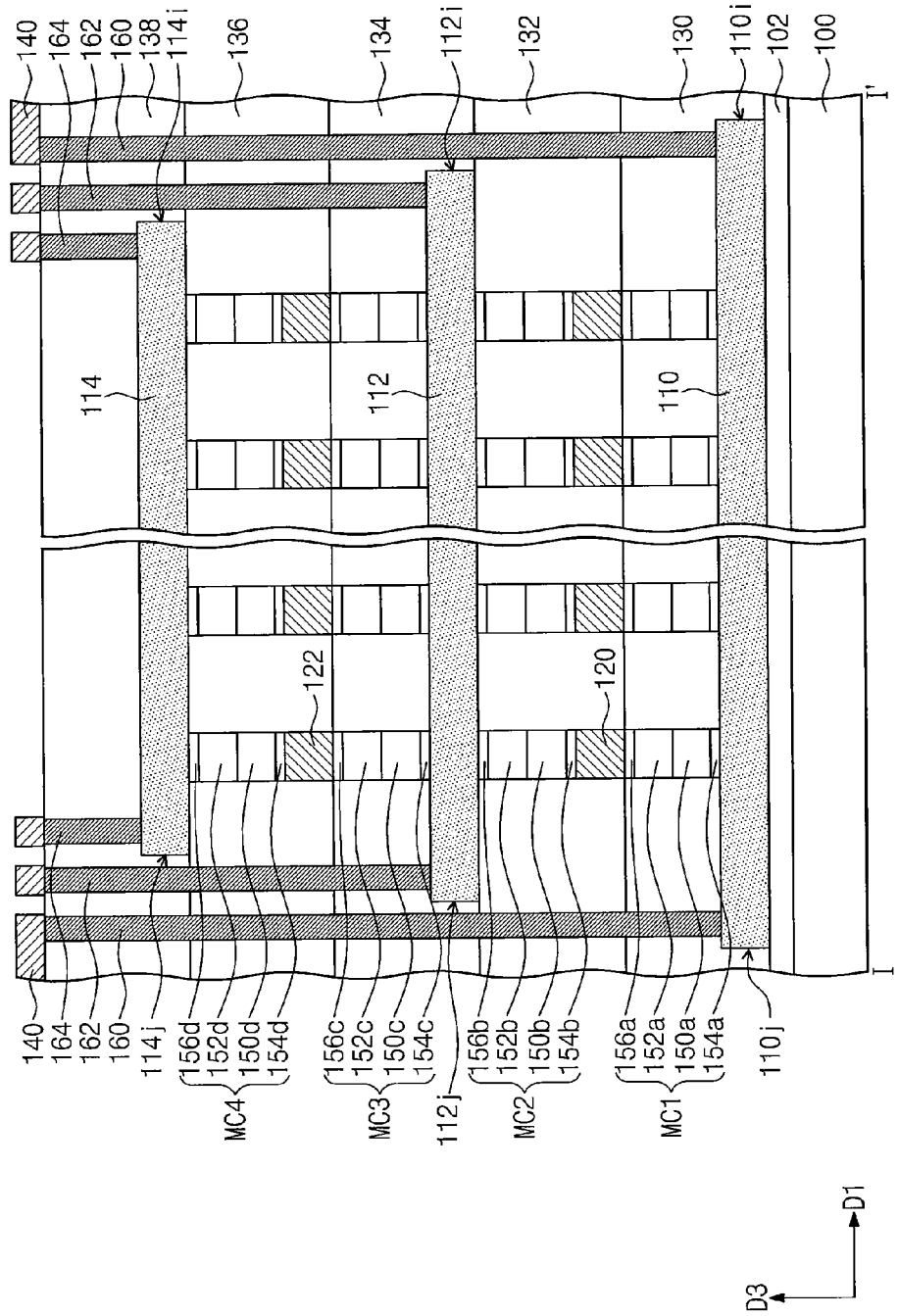
FIG. 9 is a cross-sectional view taken along a line I-I' of FIG. 8.
Figure 10:
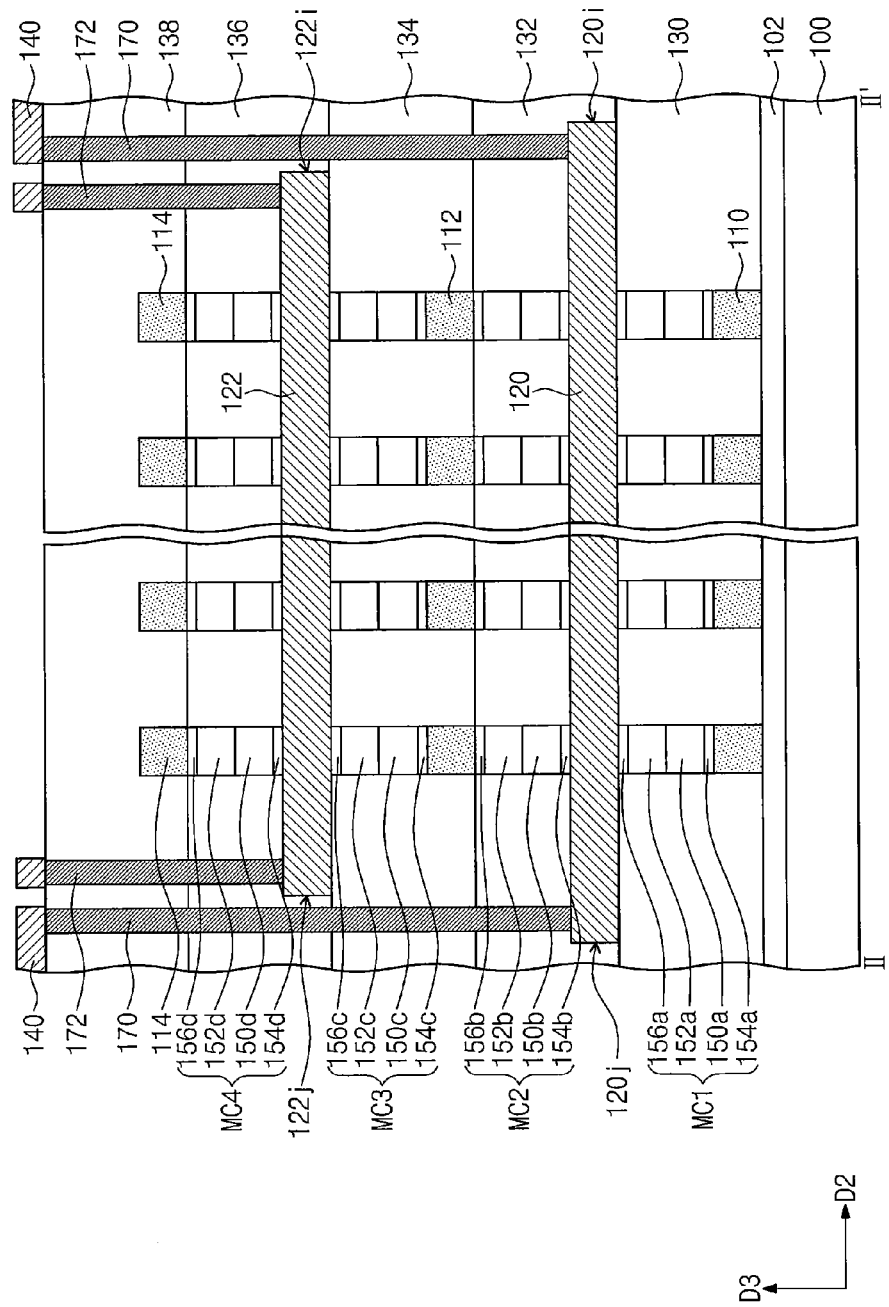
FIG. 10 is a cross-sectional view taken along a line II-II' of FIG. 8.

FIG. 8 is a plan view illustrating a variable resistance memory device according to further example embodiments of the inventive concepts. FIG. 9 is a cross-sectional view taken along a line I-I' of FIG. 8, and FIG. 10 is a cross-sectional view taken along a line II-II' of FIG. 8. In these embodiments, the same elements as described with reference to FIGS. 1 to 3 will be indicated by the same reference numerals or the same reference designators. For the purpose of ease and convenience in explanation, the descriptions to the same elements as in the embodiment of FIGS. 1 to 3 may be omitted or mentioned briefly. In other words, differences between these embodiments and the embodiment of FIGS. 1 to 3 will be mainly described hereinafter.

Referring to FIGS. 8 to 10, first, second and third word line contacts 160, 162 and 164 may be provided on a substrate 100. The first word line contact 160 may connect a respective one of the first word lines 110 to a corresponding one of upper interconnections 140, and the second word line contact 162 may connect a respective one of the second word lines 112 to a corresponding one of the upper interconnections 140. The third word line contact 164 may connect a respective one of the third word lines 114 to a corresponding one of the upper interconnections 140.

The first word line contact 160 may penetrate or extend through first, second, third, fourth and fifth interlayer insulating layers 130, 132, 134, 136 and 138 to directly connect a respective one of the first word lines 110 to the upper interconnection 140 corresponding thereto. The second word line contact 162 may penetrate or extend through the third, fourth and fifth interlayer insulating layers 134, 136 and 138 to directly connect a respective one of the second word lines 112 to the upper interconnection 140 corresponding thereto. The third word line contact 164 may penetrate or extend through the fifth interlayer insulating layer 138 to directly connect a respective one of the third word lines 114 to the upper interconnection 140 corresponding thereto. Each of the first to third word line contacts 160, 162 and 164 may be formed as a unitary member or in one body extending in the third direction D3.

Top surfaces of the first to third word line contacts 160, 162 and 164 may be disposed at the substantially same level or distance from the substrate 100. Bottom surfaces of the first to third word line contacts 160, 162 and 164 may be disposed at different levels or distances from each other. In other words, the level of the bottom surface of the first word line contact 160 may be lower than that of the bottom surface of the second word line contact 162, and the level of the bottom surface of the second word line contact 162 may be lower than that of the bottom surface of the third word line contact 164.

Each of the first word lines 110 may have a first sidewall 110i and a second sidewall 110j opposite to each other in the first direction D1. Each of the second word lines 112 may have a third sidewall 112i and a fourth sidewall 112j opposite to each other in the first direction D1. Each of the third word lines 114 may have a fifth sidewall 114i and a sixth sidewall 114j opposite to each other in the first direction D1. The first sidewall 110i, the third sidewall 112i, and the fifth sidewall 114i may be provided at a first side of a memory cell array 200 including memory cells MC1, MC2, MC3 and MC4. The second sidewall 110j, the fourth sidewall 112j, and the sixth sidewall 114j may be provided at a second side of the memory cell array 200. The first side and the second side of the memory cell array 200 may be opposite to each other in the first direction D1.

According to these embodiments, the first sidewall 110i of each of odd-numbered ones of the first word lines 110 may be spaced apart from the third sidewall 112i of each of odd-numbered ones of the second word lines 112 in the first direction D1 when viewed from a plan view, so each of the odd-numbered first word lines 110 may have an end portion not overlapping with each of the odd-numbered second word lines 112. The first word line contact 160 may be provided on the end portion of a respective one of the odd-numbered first word lines 110. The first word line contact 160 may be in contact with a top surface of the end portion of a respective one of the odd-numbered first word lines 110 but may not be in contact with the first sidewall 110i. Likewise, the third sidewall 112i of each of the odd-numbered second word lines 112 may be spaced apart from the fifth sidewall 114i of each of odd-numbered ones of the third word lines 114 in the first direction D1 when viewed from a plan view, so each of the odd-numbered second word lines 112 may have an end portion not overlapping with each of the odd-numbered third word lines 114. The second word line contact 162 may be provided on the end portion of a respective one of the odd-numbered second word lines 112. The second word line contact 162 may be in contact with a top surface of the end portion of a respective one of the odd-numbered second word lines 112 but may not be in contact with the third sidewall 112i. The third word line contact 164 may be provided on an end portion of a respective one of the odd-numbered third word lines 114. The third word line contact 164 may be adjacent to the fifth sidewall 114i of a respective one of the odd-numbered third word lines 114. The third word line contact 164 may be in contact with a top surface of the end portion of a respective one of the odd-numbered third word lines 114 but may not be in contact with the fifth sidewall 114i.

According to these embodiments, the second sidewall 110j of each of even-numbered ones of the first word lines 110 may be spaced apart from the fourth sidewall 112j of each of even-numbered ones of the second word lines 112 in the first direction D1 when viewed from a plan view, so each of the even-numbered first word lines 110 may have an end portion not overlapping with each of the even-numbered second word lines 112. The first word line contact 160 may be provided on the end portion of a respective one of the even-numbered first word lines 110. The first word line contact 160 may be in contact with a top surface of the end portion of a respective one of the even-numbered first word lines 110 but may not be in contact with the second sidewall 110j. Likewise, the fourth sidewall 112j of each of the even-numbered second word lines 112 may be spaced apart from the sixth sidewall 114j of each of even-numbered ones of the third word lines 114 in the first direction D1 when viewed from a plan view, so each of the even-numbered second word lines 112 may have an end portion not overlapping with each of the even-numbered third word lines 114. The second word line contact 162 may be provided on the end portion of a respective one of the even-numbered second word lines 112. The second word line contact 162 may be in contact with a top surface of the end portion of a respective one of the even-numbered second word lines 112 but may not be in contact with the fourth sidewall 112j. The third word line contact 164 may be provided on an end portion of a respective one of the even-numbered third word lines 114. The third word line contact 164 may be adjacent to the sixth sidewall 114j of a respective one of the even-numbered third word lines 114. The third word line contact 164 may be in contact with a top surface of the end portion of a respective one of the even-numbered third word lines 114 but may not be in contact with the sixth sidewall 114j.

According to these embodiments, the first word line contact 160 connected to a respective one of the odd-numbered first word lines 110 may be provided at the first side of the memory cell array 200 in a plan view, and the first word line contact 160 connected to a respective one of the even-numbered first word lines 110 may be provided at the second side of the memory cell array 200 in a plan view, as illustrated in FIG. 8. In other words, a plurality of the first word line contacts 160 may be arranged in a zigzag form (on alternating ends of the word lines) along the second direction D2 with the memory cell array 200 interposed therebetween. Likewise, the second word line contact 162 connected to a respective one of the odd-numbered second word lines 112 may be provided at the first side of the memory cell array 200 in a plan view, and the second word line contact 162 connected to a respective one of the even-numbered second word lines 112 may be provided at the second side of the memory cell array 200 in a plan view. In other words, a plurality of the second word line contacts 162 may be arranged in a zigzag form (on alternating ends of the word lines) along the second direction D2 with the memory cell array 200 interposed therebetween. In addition, the third word line contact 164 connected to a respective one of the odd-numbered third word lines 114 may be provided at the first side of the memory cell array 200 in a plan view, and the third word line contact 164 connected to a respective one of the even-numbered third word lines 114 may be provided at the second side of the memory cell array 200 in a plan view. In other words, a plurality of the third word line contacts 164 may be arranged in a zigzag form (on alternating ends of the word lines) along the second direction D2 with the memory cell array 200 interposed therebetween. That is, the first, second, and third word line contacts 160, 162, and 164 may contact alternating ones of the first, second, and third word lines 110, 112, 114, respectively, on a same side of the memory cell array 200.

According to these embodiments, each of the first word lines 110 may be connected to first peripheral circuits 201a and 201b through the first word line contact 160 and the upper interconnection 140 connected to the first word line contact 160. In some embodiments, the first peripheral circuits 201a and 201b may be disposed under the memory cell array 200, so the first peripheral circuits 201a and 201b and the memory cell array 200 may be vertically stacked on the substrate 100, as described with reference to FIG. 4. In other embodiments, the first peripheral circuits 201a and 201b may be laterally spaced apart from the memory cell array 200 on the substrate 100, as described with reference to FIG. 5. In this case, the first peripheral circuits 201a and 201b may be spaced apart from each other in the first direction D1 with the memory cell array 200 interposed therebetween when viewed from a plan view. In this case, each of the odd-numbered first word lines 110 may be connected to the first peripheral circuit 201a adjacent to the first side of the memory cell array 200 through a respective first word line contact 160 and the upper interconnection 140 connected to the first word line contact 160. Each of the even-numbered first word lines 110 may be connected to the first peripheral circuit 201b adjacent to the second side of the memory cell array 200 through the first word line contact 160 and the upper interconnection 140 connected to the first word line contact 160.

Likewise, each of the second word lines 112 may be connected to the first peripheral circuits 201a and 201b through the second word line contact 162 and the upper interconnection 140 connected to the second word line contact 162. If the first peripheral circuits 201a and 201b are laterally spaced apart from the memory cell array 200 on the substrate 100 as described with reference to FIG. 5, each of the odd-numbered second word lines 112 may be connected to the first peripheral circuit 201a adjacent to the first side of the memory cell array 200 through a respective second word line contact 162 and the upper interconnection 140 connected thereto, and each of the even-numbered second word lines 112 may be connected to the first peripheral circuit 201b adjacent to the second side of the memory cell array 200 through a respective second word line contact 162 and the upper interconnection 140 connected thereto.

In addition, each of the third word lines 114 may be connected to the first peripheral circuits 201a and 201b through a respective third word line contact 164 and the upper interconnection 140 connected to the third word line contact 164. If the first peripheral circuits 201a and 201b are laterally spaced apart from the memory cell array 200 on the substrate 100 as described with reference to FIG. 5, each of the odd-numbered third word lines 114 may be connected to the first peripheral circuit 201a adjacent to the first side of the memory cell array 200 through a respective third word line contact 164 and the upper interconnection 140 connected thereto, and each of the even-numbered third word lines 114 may be connected to the first peripheral circuit 201b adjacent to the second side of the memory cell array 200 through a respective third word line contact 164 and the upper interconnection 140 connected thereto.

First and second bit line contacts 170 and 172 may be provided on the substrate 100. The first bit line contact 170 may connect a respective one of the first bit lines 120 to a corresponding one of the upper interconnections 140, and the second bit line contact 172 may connect a respective one of the second bit lines 122 to a corresponding one of the upper interconnections 140.

The first bit line contact 170 may penetrate or extend through the second to fifth interlayer insulating layers 132, 134, 136 and 138 to directly connect a respective one of the first bit lines 120 to the upper interconnection 140 corresponding thereto. The second bit line contact 172 may penetrate or extend through the fourth and fifth interlayer insulating layers 136 and 138 to directly connect a respective one of the second bit lines 122 to the upper interconnection 140 corresponding thereto. Each of the first and second bit line contacts 170 and 172 may be formed as a unitary member or in one body extending in the third direction D3.

Top surfaces of the first and second bit line contacts 170 and 172 may be disposed at the substantially same level or distance from the substrate 100. Bottom surfaces of the first and second bit line contacts 170 and 172 may be disposed at different levels or distances from each other. In other words, the level of the bottom surface of the first bit line contact 170 may be lower than that of the bottom surface of the second bit line contact 172.

Each of the first bit lines 120 may have a seventh sidewall 120i and an eighth sidewall 120j opposite to each other in the second direction D2. Each of the second bit lines 122 may have a ninth sidewall 122i and a tenth sidewall 122j opposite to each other in the second direction D2. The seventh sidewall 120i and the ninth sidewall 122i may be provided at a third side of the memory cell array 200, and the eighth sidewall 120j and the tenth sidewall 122j may be provided at a fourth side of the memory cell array 200. The third side and the fourth side of the memory cell array 200 may be opposite to each other in the second direction D2.

According to these embodiments, the seventh sidewall 120i of each of odd-numbered ones of the first bit lines 120 may be spaced apart from the ninth sidewall 122i of each of odd-numbered ones of the second bit lines 122 in the second direction D2 when viewed from a plan view, so each of the odd-numbered first bit lines 120 may have an end portion not overlapping with each of the odd-numbered second bit lines 122. The first bit line contact 170 may be provided on the end portion of a respective one of the odd-numbered first bit lines 120. The first bit line contact 170 may be in contact with a top surface of the end portion of a respective one of the odd-numbered first bit lines 120 but may not be in contact with the seventh sidewall 120i. The second bit line contact 172 may be provided on an end portion of a respective one of the odd-numbered second bit lines 122. The second bit line contact 172 may be adjacent to the ninth sidewall 122i of a respective one of the odd-numbered second bit lines 122. The second bit line contact 172 may be in contact with a top surface of the end portion of a respective one of the odd-numbered second bit lines 122 but may not be in contact with the ninth sidewall 122i.

According to these embodiments, the eighth sidewall 120j of each of even-numbered ones of the first bit lines 120 may be spaced apart from the tenth sidewall 122j of each of even-numbered ones of the second bit lines 122 in the second direction D2 when viewed from a plan view, so each of the even-numbered first bit lines 120 may have an end portion not overlapping with each of the even-numbered second bit lines 122. The first bit line contact 170 may be provided on the end portion of a respective one of the even-numbered first bit lines 120. The first bit line contact 170 may be in contact with a top surface of the end portion of a respective one of the even-numbered first bit lines 120 but may not be in contact with the eighth sidewall 120j. The second bit line contact 172 may be provided on an end portion of a respective one of the even-numbered second bit lines 122. The second bit line contact 172 may be adjacent to the tenth sidewall 122j of a respective one of the even-numbered second bit lines 122. The second bit line contact 172 may be in contact with a top surface of the end portion of a respective one of the even-numbered second bit lines 122 but may not be in contact with the tenth sidewall 122j.

According to these embodiments, the first bit line contact 170 connected to a respective one of the odd-numbered first bit lines 120 may be provided at the third side of the memory cell array 200 in a plan view, and the first bit line contact 170 connected to a respective one of the even-numbered first bit lines 120 may be provided at the fourth side of the memory cell array 200 in a plan view, as illustrated in FIG. 8. In other words, a plurality of the first bit line contacts 170 may be arranged in a zigzag form (on alternating ends of the bit lines) along the first direction D1 with the memory cell array 200 interposed therebetween. Likewise, the second bit line contact 172 connected to a respective one of the odd-numbered second bit lines 122 may be provided at the third side of the memory cell array 200 in a plan view, and the second bit line contact 172 connected to a respective one of the even-numbered second bit lines 122 may be provided at the fourth side of the memory cell array 200 in a plan view. In other words, a plurality of the second bit line contacts 172 may be arranged in a zigzag form (on alternating ends of the bit lines) along the first direction D1 with the memory cell array 200 interposed therebetween. That is, the first and second bit line contacts 170 and 172 may contact alternating ones of the first and second bit lines 120 and 122, respectively, on a same side of the memory cell array 200.

According to these embodiments, each of the first bit lines 120 may be connected to second peripheral circuits 203a and 203b through a respective first bit line contact 170 and the upper interconnection 140 connected to the first bit line contact 170. In some embodiments, the second peripheral circuits 203a and 203b may be disposed under the memory cell array 200, so the second peripheral circuits 203a and 203b and the memory cell array 200 may be vertically stacked on the substrate 100, as described with reference to FIG. 4. In other embodiments, the second peripheral circuits 203a and 203b may be laterally spaced apart from the memory cell array 200 on the substrate 100, as described with reference to FIG. 5. In this case, the second peripheral circuits 203a and 203b may be spaced apart from each other in the second direction D2 with the memory cell array 200 interposed therebetween when viewed from a plan view. In this case, each of the odd-numbered first bit lines 120 may be connected to the second peripheral circuit 203a adjacent to the third side of the memory cell array 200 through a respective first bit line contact 170 and the upper interconnection 140 connected to the first bit line contact 170. Each of the even-numbered first bit lines 120 may be connected to the second peripheral circuit 203b adjacent to the fourth side of the memory cell array 200 through a respective first bit line contact 170 and the upper interconnection 140 connected to the first bit line contact 170.

Likewise, each of the second bit lines 122 may be connected to the second peripheral circuits 203a and 203b through a respective second bit line contact 172 and the upper interconnection 140 connected to the second bit line contact 172. If the second peripheral circuits 203a and 203b are laterally spaced apart from the memory cell array 200 on the substrate 100 as described with reference to FIG. 5, each of the odd-numbered second bit lines 122 may be connected to the second peripheral circuit 203a adjacent to the third side of the memory cell array 200 through a respective second bit line contact 172 and the upper interconnection 140 connected thereto, and each of the even-numbered second bit lines 122 may be connected to the second peripheral circuit 203b adjacent to the fourth side of the memory cell array 200 through a respective second bit line contact 172 and the upper interconnection 140 connected thereto.

Figure 11:
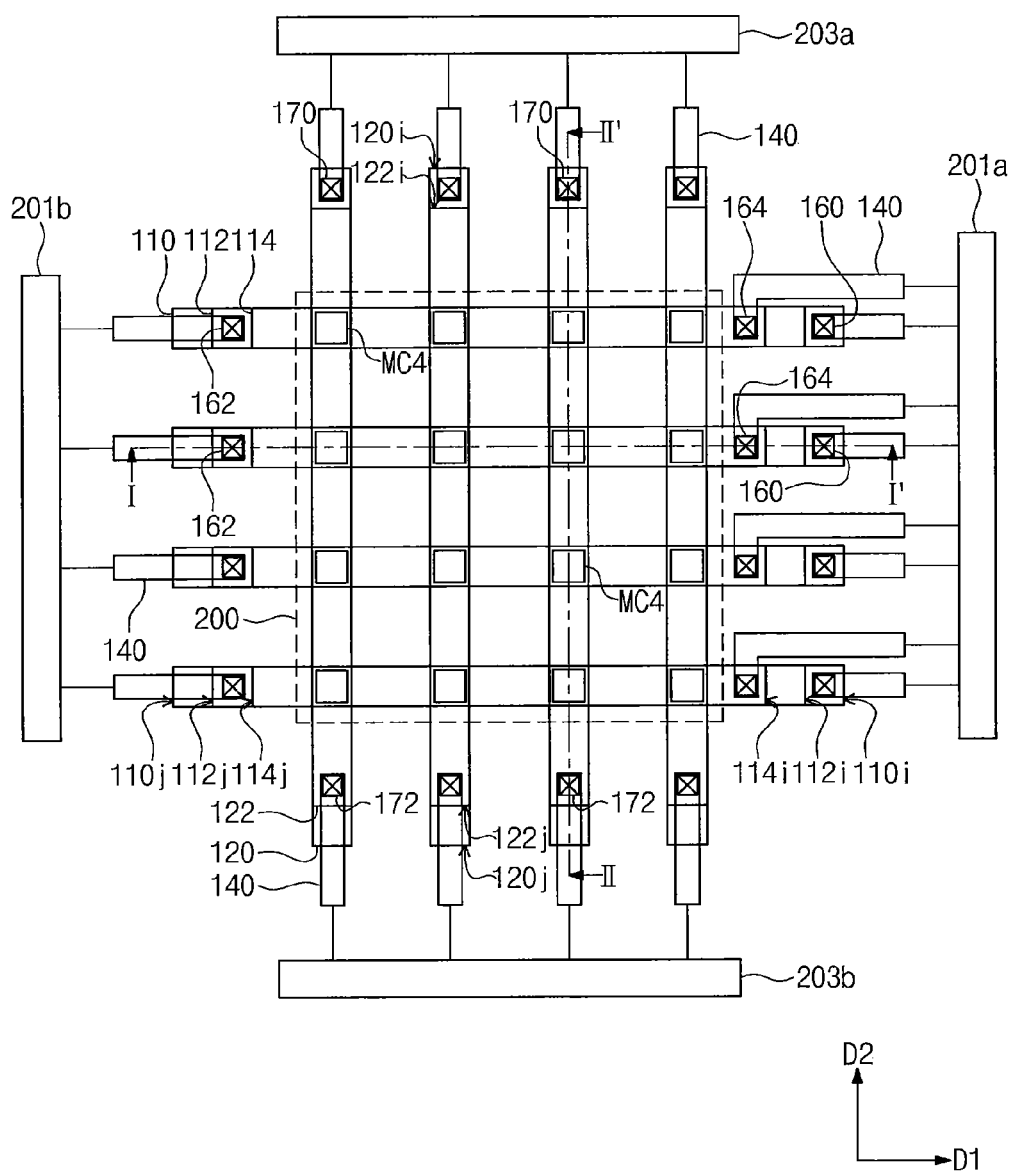
FIG. 11 is a plan view illustrating a variable resistance memory device according still further example embodiments of the inventive concepts.
Figure 12:
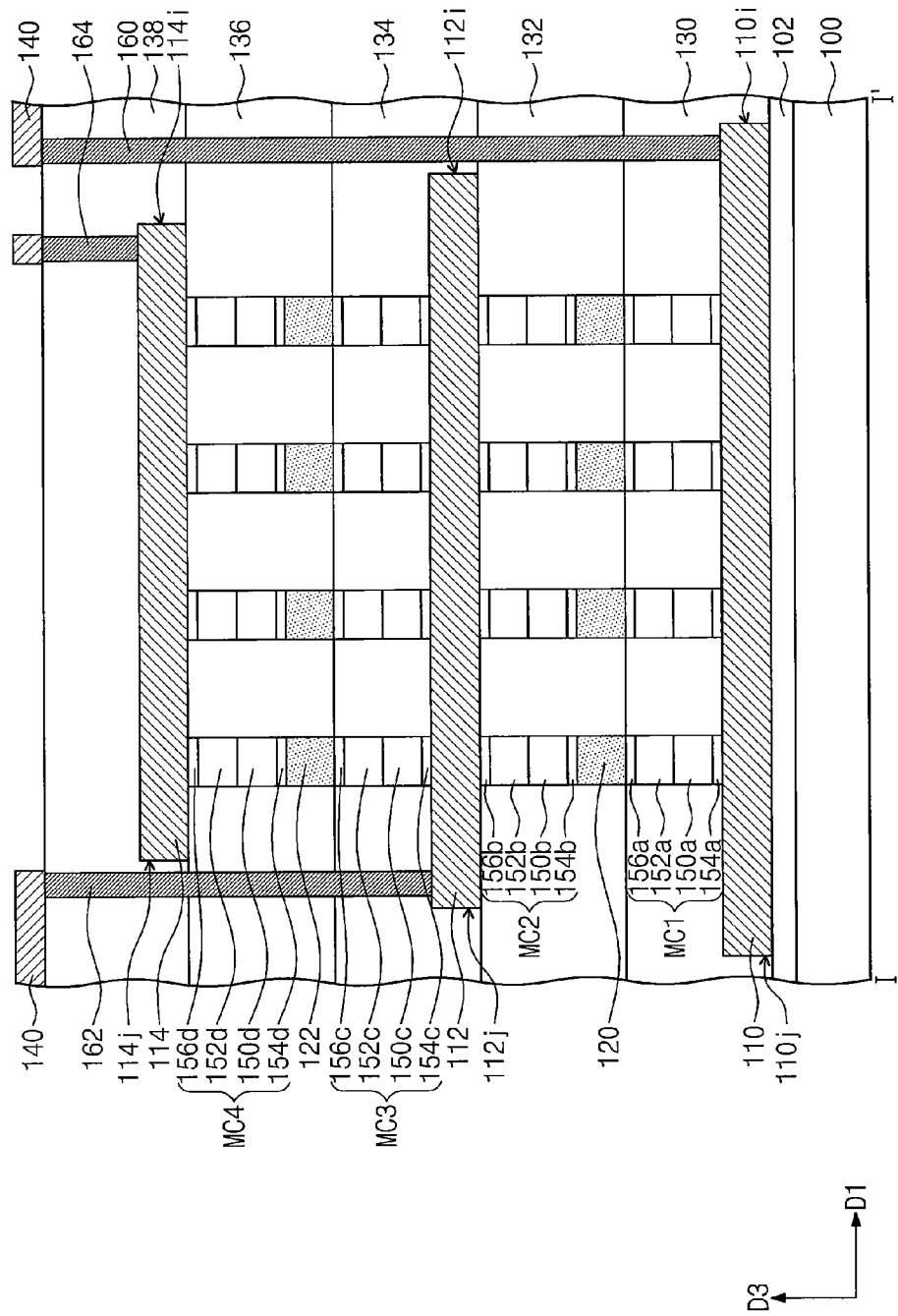
FIG. 12 is a cross-sectional view taken along a line I-I' of FIG. 11.
Figure 13:
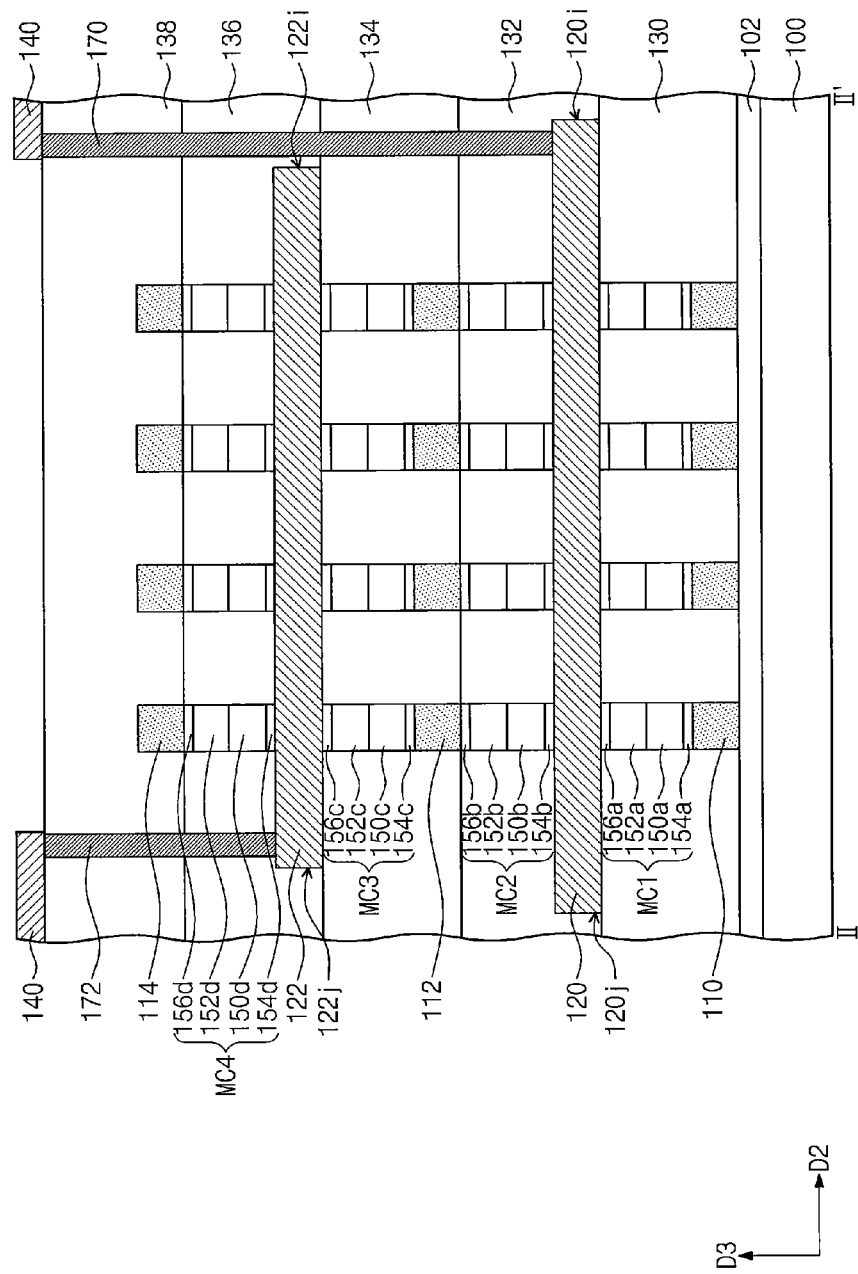
FIG. 13 is a cross-sectional view taken along a line II-II' of FIG. 11.

FIG. 11 is a plan view illustrating a variable resistance memory device according to still further example embodiments of the inventive concepts. FIG. 12 is a cross-sectional view taken along a line I-I' of FIG. 11, and FIG. 13 is a cross-sectional view taken along a line II-II' of FIG. 11. In these embodiments, the same elements as described with reference to FIGS. 1 to 3 will be indicated by the same reference numerals or the same reference designators. For the purpose of ease and convenience in explanation, the descriptions to the same elements as in the embodiment of FIGS. 1 to 3 may be omitted or mentioned briefly. In other words, differences between these embodiments and the embodiment of FIGS. 1 to 3 will be mainly described hereinafter.

Referring to FIGS. 11 to 13, first, second and third word line contacts 160, 162 and 164 may be provided on a substrate 100. The first word line contact 160 may connect a respective one of the first word lines 110 to a corresponding one of upper interconnections 140, and the second word line contact 162 may connect a respective one of the second word lines 112 to a corresponding one of the upper interconnections 140. The third word line contact 164 may connect a respective one of the third word lines 114 to a corresponding one of the upper interconnections 140.

The first word line contact 160 may penetrate or extend through first, second, third, fourth and fifth interlayer insulating layers 130, 132, 134, 136 and 138 to directly connect a respective one of the first word lines 110 to the upper interconnection 140 corresponding thereto. The second word line contact 162 may penetrate or extend through the third, fourth and fifth interlayer insulating layers 134, 136 and 138 to directly connect a respective one of the second word lines 112 to the upper interconnection 140 corresponding thereto. The third word line contact 164 may penetrate or extend through the fifth interlayer insulating layer 138 to directly connect a respective one of the third word lines 114 to the upper interconnection 140 corresponding thereto. Each of the first to third word line contacts 160, 162 and 164 may be formed as a unitary member or in one body extending in the third direction D3.

Top surfaces of the first to third word line contacts 160, 162 and 164 may be disposed at the substantially same level or distance from the substrate 100. Bottom surfaces of the first to third word line contacts 160, 162 and 164 may be disposed at different levels or distances from each other. In other words, the level of the bottom surface of the first word line contact 160 may be lower than that of the bottom surface of the second word line contact 162, and the level of the bottom surface of the second word line contact 162 may be lower than that of the bottom surface of the third word line contact 164.

Each of the first word lines 110 may have a first sidewall 110i and a second sidewall 110j opposite to each other in the first direction D1. Each of the second word lines 112 may have a third sidewall 112i and a fourth sidewall 112j opposite to each other in the first direction D1. Each of the third word lines 114 may have a fifth sidewall 114i and a sixth sidewall 114j opposite to each other in the first direction D1. The first sidewall 110i, the third sidewall 112i, and the fifth sidewall 114i may be provided at a first side of a memory cell array 200 including memory cells MC1, MC2, MC3 and MC4. The second sidewall 110j, the fourth sidewall 112j, and the sixth sidewall 114j may be provided at a second side of the memory cell array 200. The first side and the second side of the memory cell array 200 may be opposite to each other in the first direction D1.

According to these embodiments, the first sidewall 110i of each of the first word lines 110 may be spaced apart from the third sidewall 112i of each of the second word lines 112 in the first direction D1 when viewed from a plan view. Thus, each of the first word lines 110 may have an end portion not overlapping with each of the second word lines 112. The first word line contact 160 may be provided on the end portion of a respective one of the first word lines 110. The first word line contact 160 may be in contact with a top surface of the end portion of a respective one of the first word lines 110 but may not be in contact with the first sidewall 110i. The fourth sidewall 112j of each of the second word lines 112 may be spaced apart from the sixth sidewall 114j of each of the third word lines 114 in the first direction D1 when viewed from a plan view. Thus, each of the second word lines 112 may have an end portion not overlapping with each of the third word lines 114. The second word line contact 162 may be provided on the end portion of a respective one of the second word lines 112. The second word line contact 162 may be in contact with a top surface of the end portion of a respective one of the second word lines 112 but may not be in contact with the fourth sidewall 112*j*. The third word line contact 164 may be provided on an end portion of a respective one of the third word lines 114. The third word line contact 164 may be adjacent to the fifth sidewall 114*i* of a respective one of the third word lines 114. The third word line contact 164 may be in contact with a top surface of the end portion of a respective one of the third word lines 114 but may not be in contact with the fifth sidewall 114*i*.

According to these embodiments, the first and third word line contacts 160 and 164 may be provided at the first side of the memory cell array 200, and the second word line contact 162 may be provided at the second side of the memory cell array 200, as illustrated in FIG. 11.

According to these embodiments, first peripheral circuits 201*a* and 201*b* may be provided to be connected to the first to third word lines 110, 112 and 114. Each of the first word lines 110 may be connected to the first peripheral circuits 201*a* and 201*b* through the first word line contact 160 and the upper interconnection 140 connected to the first word line contact 160. Each of the second word lines 112 may be connected to the first peripheral circuits 201*a* and 201*b* through the second word line contact 162 and the upper interconnection 140 connected to the second word line contact 162. Each of the third word lines 114 may be connected to the first peripheral circuits 201*a* and 201*b* through the third word line contact 164 and the upper interconnection 140 connected to the third word line contact 164.

In some embodiments, the first peripheral circuits 201*a* and 201*b* may be disposed under the memory cell array 200, so the first peripheral circuits 201*a* and 201*b* and the memory cell array 200 may be vertically stacked on the substrate 100, as described with reference to FIG. 4. In other embodiments, the first peripheral circuits 201*a* and 201*b* may be laterally spaced apart from the memory cell array 200 on the substrate 100, as described with reference to FIG. 5. In this case, the first peripheral circuits 201*a* and 201*b* may be spaced apart from each other in the first direction D1 with the memory cell array 200 interposed therebetween when viewed from a plan view. In this case, each of the first word lines 110 may be connected to the first peripheral circuit 201*a* adjacent to the first side of the memory cell array 200 through a respective first word line contact 160 and the upper interconnection 140 connected thereto, and each of the second word lines 112 may be connected to the first peripheral circuit 201*b* adjacent to the second side of the memory cell array 200 through a respective second word line contact 162 and the upper interconnection 140 connected thereto. Each of the third word lines 114 may be connected to the first peripheral circuit 201*a* adjacent to the first side of the memory cell array 200 through a respective third word line contact 164 and the upper interconnection 140 connected thereto.

First and second bit line contacts 170 and 172 may be provided on the substrate 100. The first bit line contact 170 may connect a respective one of the first bit lines 120 to a corresponding one of the upper interconnections 140, and the second bit line contact 172 may connect a respective one of the second bit lines 122 to a corresponding one of the upper interconnections 140.

The first bit line contact 170 may penetrate or extend through the second to fifth interlayer insulating layers 132, 134, 136 and 138 to directly connect a respective one of the first bit lines 120 to the upper interconnection 140 corresponding thereto. The second bit line contact 172 may penetrate or extend through the fourth and fifth interlayer insulating layers 136 and 138 to directly connect a respective one of the second bit lines 122 to the upper interconnection 140 corresponding thereto. Each of the first and second bit line contacts 170 and 172 may be formed as a unitary member or in one body extending in the third direction D3.

Top surfaces of the first and second bit line contacts 170 and 172 may be disposed at the substantially same level or distance from the substrate 100. Bottom surfaces of the first and second bit line contacts 170 and 172 may be disposed at different levels or distances from each other. In other words, the level of the bottom surface of the first bit line contact 170 may be lower than that of the bottom surface of the second bit line contact 172.

Each of the first bit lines 120 may have a seventh sidewall 120*i* and an eighth sidewall 120*j* opposite to each other in the second direction D2. Each of the second bit lines 122 may have a ninth sidewall 122*i* and a tenth sidewall 122*j* opposite to each other in the second direction D2. The seventh sidewall 120*i* and the ninth sidewall 122*i* may be provided at a third side of the memory cell array 200, and the eighth sidewall 120*j* and the tenth sidewall 122*j* may be provided at a fourth side of the memory cell array 200. The third side and the fourth side of the memory cell array 200 may be opposite to each other in the second direction D2.

According to these embodiments, the seventh sidewall 120*i* of each of the first bit lines 120 may be spaced apart from the ninth sidewall 122*i* of each of the second bit lines 122 in the second direction D2 when viewed from a plan view. Thus, each of the first bit lines 120 may have an end portion not overlapping with each of the second bit lines 122. The first bit line contact 170 may be provided on the end portion of a respective one of the first bit lines 120. The first bit line contact 170 may be in contact with a top surface of the end portion of a respective one of the first bit lines 120 but may not be in contact with the seventh sidewall 120*i*. The second bit line contact 172 may be provided on an end portion of a respective one of the second bit lines 122. The second bit line contact 172 may be adjacent to the tenth sidewall 122*j* of a respective one of the second bit lines 122. The second bit line contact 172 may be in contact with a top surface of the end portion of a respective one of the second bit lines 122 but may not be in contact with the tenth sidewall 122*j*.

According to these embodiments, the first bit line contact 170 may be provided at the third side of the memory cell array 200, and the second bit line contact 172 may be provided at the fourth side of the memory cell array 200, as illustrated in FIG. 11.

According to these embodiments, second peripheral circuits 203*a* and 203*b* may be connected to the first and second bit lines 120 and 122. Each of the first bit lines 120 may be connected to the second peripheral circuits 203*a* and 203*b* through a respective first bit line contact 170 and the upper interconnection 140 connected to the first bit line contact 170, and each of the second bit lines 122 may be connected to the second peripheral circuits 203*a* and 203*b* through a respective second bit line contact 172 and the upper interconnection 140 connected to the second bit line contact 172.

In some embodiments, the second peripheral circuits 203*a* and 203*b* may be disposed under the memory cell array 200, so the second peripheral circuits 203*a* and 203*b* and the memory cell array 200 may be vertically stacked on the substrate 100, as described with reference to FIG. 4. In other embodiments, the second peripheral circuits 203a and 203b may be laterally spaced apart from the memory cell array 200 on the substrate 100, as described with reference to FIG. 5. In this case, the second peripheral circuits 203a and 203b may be spaced apart from each other in the second direction D2 with the memory cell array 200 interposed therebetween when viewed from a plan view. In this case, each of the first bit lines 120 may be connected to the second peripheral circuit 203a adjacent to the third side of the memory cell array 200 through a respective first bit line contact 170 and the upper interconnection 140 connected thereto, and each of the second bit lines 122 may be connected to the second peripheral circuit 203b adjacent to the fourth side of the memory cell array 200 through a respective second bit line contact 172 and the upper interconnection connected thereto.

According to the above mentioned embodiments of the inventive concepts, the first word line, the second word line, and the third word line which are vertically stacked on the substrate may be directly connected to corresponding ones of the upper interconnections through the first word line contact, the second word line contact, and the third word line contact, respectively. Each of the first to third word line contacts may be formed as a unitary member or in one body extending in a direction perpendicular to the top surface of the substrate. In addition, the first bit line and the second bit line which are vertically stacked on the substrate may be directly connected to corresponding ones of the upper interconnections through the first bit line contact and the second bit line contact, respectively. Each of the first and second bit line contacts may be formed as a unitary member or in one body extending in the direction perpendicular to the top surface of the substrate. Since the first to third word line contacts and the first and second bit line contacts are formed to directly connect the first to third word lines and the first and second bit lines to the corresponding upper interconnections, respectively, a manufacture cost of the variable resistance memory device may be reduced by simple structures of the contacts. If each of word and bit lines is connected to a corresponding upper interconnection through a plurality of conductive lines and a plurality of contacts, a manufacture cost of a memory device may be increased. In addition, the first to third word line contacts and the first and second bit line contacts according to the inventive concepts may be formed at the same time or in a same fabrication operation, so the variable resistance memory device according to the inventive concepts may be easily manufactured.

Figure 14:
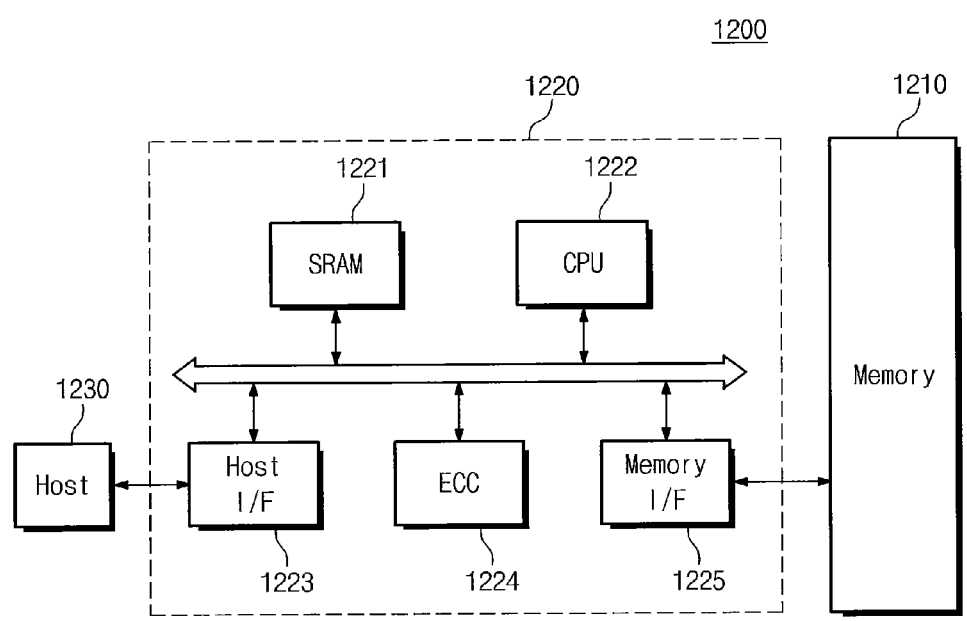
FIG. 14 is a schematic block diagram illustrating a memory card including a variable resistance memory device according to embodiments of the inventive concepts.
Figure 15:
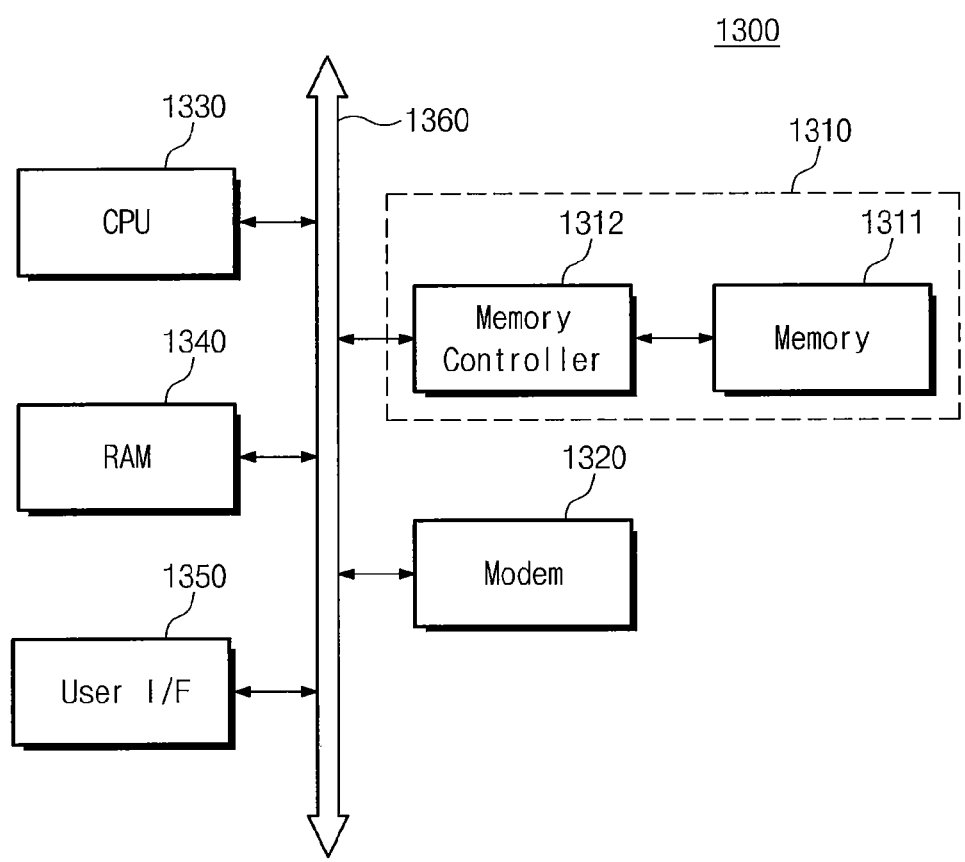
FIG. 15 is a schematic block diagram illustrating an information processing system including a variable resistance memory device according to embodiments of the inventive concepts.

FIG. 14 is a schematic block diagram illustrating a memory card including a variable resistance memory device according to embodiments of the inventive concepts. FIG. 15 is a schematic block diagram illustrating an information processing system including a variable resistance memory device according to embodiments of the inventive concepts.

Referring to FIG. 14, a memory card 1200 may include a memory controller 1220 that controls overall data communication between a host 1230 and a memory device 1210. A static random access memory (SRAM) device 1221 may be used as a working memory of a central processing unit (CPU) 1222. A host interface unit 1223 may be configured to include a data communication protocol between the memory card 1200 and the host 1230. An error check and correction (ECC) block 1224 may detect and correct errors of data which are read out from the memory device 1210. A memory interface unit 1225 may interface with the memory device 1210. The CPU 1222 may perform overall operations of the memory card 1200. The memory device 1210 may include at least one of the variable resistance memory devices according to the above mentioned embodiments of the inventive concepts.

Referring to FIG. 15, an information processing system 1300 may include a memory system 1310 implemented with at least one of the variable resistance memory devices according to the aforementioned embodiments of the inventive concepts. The information processing system 1300 may be realized as a mobile device or a computer. In some embodiments, the information processing system 1300 may include the memory system 1310, a modem 1320, a central processing unit (CPU) 1330, a random access memory (RAM) 1340, and a user interface unit 1350 which are electrically connected to a system bus 1360. The memory system 1310 may include a memory device 1311 and a memory controller 1312 and may be the substantially same as the memory card 1200 of FIG. 14. Data processed by the CPU 1330 and/or data input from an external system may be stored in the memory system 1310. The information processing system 1300 may further include a memory card, a solid state disk (SSD), a camera image sensor (CIS), and/or another application chipset.

According to the inventive concepts, the first, second and third word lines vertically stacked on the substrate may be directly connected to corresponding ones of the upper interconnections through the first, second and third word line contacts, respectively. Each of the first to third word line contacts may be formed as a unitary member or in one body extending in a direction perpendicular to the top surface of the substrate. In addition, the first and second bit lines vertically stacked on the substrate may be directly connected to corresponding ones of the upper interconnections through the first and second bit line contacts, respectively. Each of the first and second bit line contacts may be formed as a unitary member or in one body extending in the direction perpendicular to the top surface of the substrate. If each of word and bit lines is connected to a corresponding upper interconnection through a plurality of conductive lines and a plurality of contacts, a manufacture cost of a memory device may be increased by complicated manufacture processes. However, as described above, the first to third word line contacts and the first and second bit line contacts according to the inventive concepts may be formed to directly connect the first to third word lines and the first and second bit lines to the corresponding upper interconnections, respectively, so the manufacture cost of the variable resistance memory device according to the inventive concepts may be reduced or minimized. Additionally, the first to third word line contacts and the first and second bit line contacts according to the inventive concepts may be formed at the same time or in a same fabrication operation, so the variable resistance memory device may be more easily manufactured.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A variable resistance memory device comprising:
upper interconnections on a substrate;

a first word line and a second word line between the substrate and the upper interconnections, the first and second word lines spaced apart from each other in a direction that is perpendicular to a top surface of the substrate;

a first bit line disposed between the first word line and the second word line, the first bit line intersecting the first and second word lines;

memory cells provided in an intersecting region of the first word line and the first bit line and an intersecting region of the second word line and the first bit line;

a first word line contact comprising a first unitary member directly connecting the first word line to a first one of the upper interconnections, wherein the first unitary member is in direct contact with the first word line and the first one of the upper interconnections, and a lowermost surface of the first unitary member is disposed at a level higher than that of a bottom surface of the first word line from the substrate; and a second word line contact comprising a second unitary member directly connecting the second word line to a second one of the upper interconnections, wherein the second unitary member is in direct contact with the second word line and the second one of the upper interconnections, and a lowermost surface of the second unitary member is disposed at a level higher than that of a bottom surface of the second word line from the substrate, wherein the first word line is connected to a first peripheral circuit through the first word line contact and the first one of the upper interconnections that is connected to the first word line contact, and wherein the second word line is connected to the first peripheral circuit through the second word line contact and the second one of the upper interconnections that is connected to the second word line contact.

2. The variable resistance memory device of claim 1, further comprising:

a second bit line between the substrate and the upper interconnections, the second bit line spaced apart from the first bit line with the second word line interposed therebetween in the direction perpendicular to the top surface of the substrate;

a first bit line contact comprising a third unitary member directly connecting the first bit line to a third one of the upper interconnections, wherein the third unitary member is in direct contact with the first bit line and the third one of the upper interconnections, and a lowermost surface of the third unitary member is disposed at a level higher than that of a bottom surface of the first bit line from the substrate; and a second bit line contact comprising a fourth unitary member directly connecting the second bit line to a fourth one of the upper interconnections, wherein the fourth unitary member is in direct contact with the second bit line and the fourth one of the upper interconnections, and a lowermost surface of the fourth unitary member is disposed at a level higher than that of a bottom surface of the second bit line from the substrate, wherein the memory cells further comprise a memory cell provided in an intersecting region of the second word line and the second bit line, wherein the first bit line is connected to a second peripheral circuit through the first bit line contact and the third one of the upper interconnections, and wherein the second bit line is connected to the second peripheral circuit through the second bit line contact and the fourth one of the upper interconnections, and wherein the first and second word lines or the first and second bit lines are of different lengths and are sequentially stacked in order of decreasing length away from the top surface of the substrate in the direction perpendicular thereto.

3. A variable resistance memory device comprising:

upper interconnections on a substrate;

a first word line, a second word line, and a third word line between the substrate and the upper interconnections, the first and second and third word lines spaced apart from each other in a direction that is perpendicular to a top surface of the substrate;

a first bit line disposed between the first word line and the second word line, the first bit line intersecting the first and second word lines;

a second bit line disposed between the second word line and the third word line, the second bit line intersecting the second and third word lines;

memory cells provided in an intersecting region of the first word line and the first bit line, an intersecting region of the second word line and the first bit line, an intersecting region of the second word line and the second bit line, and an intersecting region of the third word line and the second bit line;

a first word line contact comprising a unitary member directly connecting the first word line to a corresponding one of the upper interconnections;

a second word line contact comprising a unitary member directly connecting the second word line to a corresponding one of the upper interconnections;

a third word line contact comprising a unitary member directly connecting the third word line to a corresponding one of the upper interconnections;

a first bit line contact comprising a unitary member directly connecting the first bit line to a corresponding one of the upper interconnections; and a second bit line contact comprising a unitary member directly connecting the second bit line to a corresponding one of the upper interconnections, wherein top surfaces of the first word line contact, the second word line contact, the third word line contact, the first bit line contact, and the second bit line contact are disposed at a same distance from the substrate, wherein bottom surfaces of the first word line contact, the second word line contact, the third word line contact, the first bit line contact, and the second bit line contact are disposed at different distances from the substrate, and wherein the first, second, and third word lines and/or the first and second bit lines are sequentially stacked in order of decreasing length away from the top surface of the substrate in the direction perpendicular thereto.

4. The variable resistance memory device of claim 3, further comprising:

at least one peripheral circuit configured to apply a predetermined voltage or current to each of the first word line, the second word line, the third word line, the first bit line, and the second bit line, wherein the first word line is connected to the peripheral circuit through the first word line contact and the one of the upper interconnections that is connected to the first word line contact, wherein the second word line is connected to the peripheral circuit through the second word line contact and the one of the upper interconnections that is connected to the second word line contact, wherein the third word line is connected to the peripheral circuit through the third word line contact and the one of the upper interconnections that is connected to the third word line contact, wherein the first bit line is connected to the peripheral circuit through the first bit line contact and the one of the upper interconnections that is connected to the first bit line contact, and wherein the second bit line is connected to the peripheral circuit through the second bit line contact and the one of the upper interconnections that is connected to the second bit line contact.

5. The variable resistance memory device of claim 4, wherein the peripheral circuit is between the substrate and a memory cell array including the memory cells, and wherein the peripheral circuit and the memory cell array are vertically stacked on the substrate.

6. The variable resistance memory device of claim 3, wherein the first word line contact, the second word line contact, the third word line contact, the first bit line contact, and the second bit line contact include a same material.

7. The variable resistance memory device of claim 3, wherein the first word line is disposed at a lower level than the second word line and the second word line is disposed at a lower level than the third word line, relative to the upper interconnections, wherein the second word line extends in parallel to the first word line and overlaps with the first word line when viewed from a plan view, and the third word line extends in parallel to the second word line and overlaps with the second word line when viewed from the plan view, wherein the first word line contact is in contact with an end portion of the first word line, and wherein the end portion of the first word line does not overlap with the second word line when viewed from the plan view, and wherein the second word line contact is in contact with an end portion of the second word line, and wherein the end portion of the second word line does not overlap with the third word line when viewed from the plan view.

8. The variable resistance memory device of claim 7, wherein the third word line contact is in contact with an end portion of the third word line, and wherein the first and second and third word line contacts are disposed at a same side of a memory cell array including the memory cells when viewed from the plan view.

9. The variable resistance memory device of claim 7, wherein the third word line contact is in contact with an end portion of the third word line, and wherein the first word line contact is disposed at a first side of a memory cell array including the memory cells, the second word line contact is disposed at a second side of the memory cell array opposite to the first side, and the third word line contact is disposed at the first side of the memory cell array when viewed from the plan view.

10. A memory device, comprising:
upper interconnections on a substrate;
memory cells and peripheral circuits between a surface of the substrate and the upper interconnections, wherein the upper interconnections are electrically coupled to the peripheral circuits, and wherein the memory cells are switchable between different resistance states;

word lines and bit lines alternately stacked between the surface of the substrate and the upper interconnections such that top surfaces of the word lines and top surfaces of the bit lines are at different distances from the surface of the substrate, wherein respective ones of the memory cells are at respective intersections of the word lines and bit lines; and conductive contacts that electrically couple respective ones of the upper interconnections to respective ones of the word lines or electrically couple the respective ones of the upper connections to respective ones of the bit lines, wherein the conductive contacts comprise respective unitary members extending from the top surfaces of the respective ones of the word lines or the top surfaces of the respective ones of the bit lines at the different distances from the surface of the substrate to bottom surfaces of the respective ones of the upper interconnections, and wherein lowermost surfaces of the respective unitary members are disposed at respective levels higher than that of bottom surfaces of the respective ones of the word lines or the respective ones of the bit lines from the substrate.

11. The memory device of claim 10, wherein the conductive contacts extend in a direction perpendicular to the surface of the substrate, and wherein the conductive contacts are confined between the bottom surfaces of the respective ones of the upper interconnections and the top surfaces of the respective ones of the word lines or the top surfaces of the respective ones of the bit lines and are in direct contact therewith.

12. The memory device of claim 11, wherein the respective ones of the word lines or the respective ones of the bit lines are of different lengths and are sequentially stacked in order of decreasing length away from the surface of the substrate in a direction perpendicular thereto.

13. The memory device of claim 12, wherein the bottom surfaces of the respective ones of the upper interconnections are at a same distance from the surface of the substrate.

14. The memory device of claim 12, wherein the conductive contacts electrically couple the respective ones of the word lines to a first one of the peripheral circuits or electrically couple the respective ones of the bit lines to a second one of the peripheral circuits through the respective ones of the upper interconnections.

15. The memory device of claim 14, wherein the conductive contacts comprise portions of a same conductive material.

16. The memory device of claim 15, wherein the upper interconnections comprise the same conductive material.

17. The memory device of claim 14, wherein the first and second peripheral circuits are beneath the memory cells and/or laterally adjacent thereto.

18. The memory device of claim 12, wherein the word lines and the bit lines have different thicknesses.

19. The memory device of claim 10, wherein the memory cells define an array, and wherein ones of the conductive contacts on a same side of the array extend on alternating ones of the word lines or on alternating ones of the bit lines, wherein the alternating ones of the word lines or the alternating ones of the bit lines are on coplanar surfaces.

20. The memory device of claim 10, wherein the memory cells define an array, and wherein ones of the conductive contacts on a same side of the array extend on alternating ones of the word lines or on alternating ones of the bit lines, wherein the alternating ones of the word lines or the alternating ones of the bit lines are stacked in a direction perpendicular to the surface of the substrate.

* * * * *